(12) United States Patent  
Kishida et al.

(10) Patent No.: US 8,536,863 B2
(45) Date of Patent: *Sep. 17, 2013

(54) DETECTING DEVICE HAVING VISCOELASTIC MAGNET

(75) Inventors: Takeo Kishida, Chiba (JP); Toshimitsu Tsuboi, Tokyo (JP); Tetsuharu Fukushima, Tokyo (JP); Takafumi Yabana, Nagano (JP)

(73) Assignee: Sony Corporation, Tokyo (JP)

( * ) Notice: Subject to any disclaimer, the term of this patent is extended or adjusted under 35 U.S.C. 154(b) by 269 days.

This patent is subject to a terminal disclaimer.

(21) Appl. No.: 12/642,175

(22) Filed: Dec. 18, 2009

(65) Prior Publication Data

US 2010/0090691 A1    Apr. 15, 2010

Related U.S. Application Data

(63) Continuation of application No. 11/835,815, filed on Aug. 8, 2007, now Pat. No. 7,663,362.

(30) Foreign Application Priority Data

Aug. 9, 2006   (JP) .............................. P2006-216475

(51) Int. Cl.
*G01R 33/02* (2006.01)
(52) U.S. Cl.
USPC ..................................... 324/244; 73/862.391
(58) Field of Classification Search
USPC ................. 324/207.2, 207.21, 207.25, 244; 73/862.391

See application file for complete search history.

(56) References Cited

U.S. PATENT DOCUMENTS

| 4,268,771 | A | * | 5/1981  | Lace ............................. 310/155 |
| 4,622,644 | A | * | 11/1986 | Hansen ......................... 702/153 |
| 4,922,753 | A | * | 5/1990  | Idogaki et al. ............. 73/514.08 |
| 4,954,781 | A | * | 9/1990  | Hirata .......................... 324/318 |
| 5,210,493 | A | * | 5/1993  | Schroeder et al. ............ 324/252 |
| 5,570,013 | A | * | 10/1996 | Polinsky et al. .............. 324/174 |
| 5,833,608 | A | * | 11/1998 | Acker ........................... 600/409 |
| 7,016,263 | B2 | * | 3/2006  | Gueissaz et al. ................ 368/10 |
| 7,034,524 | B2 | * | 4/2006  | Schumacher ............ 324/207.22 |
| 7,053,609 | B2 |   | 5/2006  | Saito |
| 7,415,776 | B2 |   | 8/2008  | Ochiai et al. |
| 7,446,525 | B2 | * | 11/2008 | Pullini ..................... 324/207.26 |

(Continued)

FOREIGN PATENT DOCUMENTS

| JP | 62046222 A | * | 2/1987 |
| JP | 05325150 A | * | 12/1993 |

(Continued)

OTHER PUBLICATIONS

Hall Effect Keyboard Including Magnetic Keeper; IBM Technical Disclosure Bulletin, Mar. 1972; pp. 2924-2625.*

*Primary Examiner* — Jay Patidar
(74) *Attorney, Agent, or Firm* — Finnegan, Henderson, Farabow, Garrett & Dunner, LLP

(57) ABSTRACT

A detecting device includes a viscoelastic magnet obtained by kneading and molding a magnet material and a viscoelastic material and a magnetic-flux detecting unit that detects a change in a magnetic flux density vector due to deformation of the viscoelastic magnet.

23 Claims, 31 Drawing Sheets

(56) References Cited

U.S. PATENT DOCUMENTS

| | | | |
|---|---|---|---|
| 7,451,641 B2 * | 11/2008 | Pullini et al. | 73/146 |
| 7,583,077 B2 * | 9/2009 | Pullini | 324/207.11 |
| 7,592,799 B2 * | 9/2009 | Nakajima et al. | 324/174 |
| 7,633,289 B2 * | 12/2009 | Fayaud et al. | 324/174 |
| 7,741,839 B2 * | 6/2010 | Jarrard | 324/207.2 |
| 2004/0119465 A1 * | 6/2004 | Clark | 324/174 |
| 2005/0147576 A1 * | 7/2005 | Cotton | 424/70.21 |
| 2005/0174109 A1 * | 8/2005 | Pullini | 324/207.23 |
| 2006/0077032 A1 * | 4/2006 | Momose et al. | 338/32 R |
| 2010/0199524 A1 * | 8/2010 | Grun et al. | 36/103 |

FOREIGN PATENT DOCUMENTS

| | | |
|---|---|---|
| JP | 2004-085548 | 3/2004 |
| JP | 2004-273176 | 9/2004 |
| WO | WO 2011/029575 A1 * | 3/2011 |

* cited by examiner

DETECTING DEVICE HAVING VISCOELASTIC MAGNET

CROSS-REFERENCES TO RELATED APPLICATIONS

This application is a continuation of application Ser. No. 11/835,815, filed Aug. 8, 2007 now U.S. Pat. No. 7,663,362, and claims the benefit of priority from prior Japanese Patent Application JP 2006-216475 filed in the Japanese Patent Office on Aug. 9, 2006, the entire contents of both of which are incorporated herein by reference in their entirety.

BACKGROUND OF THE INVENTION

1. Field of the Invention

The present invention relates to a detecting device and a detecting method, and, more particularly to a detecting device and a detecting method adapted to be capable of easily detecting a static state and a dynamic behavior of an object that is in contact with a robot hand or a manipulator or physical interaction of the robot hand or the manipulator with a human.

2. Description of the Related Art

In order to dexterously grip and manipulate arbitrary objects having various sizes, shapes, surface states, and weights using a robot hand or a manipulator and perform high-affinity physical interaction of the robot hand or the manipulator with a human, it is at least necessary that "a magnitude, a direction, and a distribution of a force" can be detected. It is also necessary to detect dynamic behaviors of an object such as "slide", "roll", and "vibration". Moreover, portions of the robot hand or the manipulator corresponding to a human fingertip and skin that grip an object need to have softness (viscoelasticity, super-elasticity, and rubber-like characteristic) optimum for griping and grippability generated by friction with the surface of the portion.

On the other hand, machines (a remote controller, a controller, a volume switch, etc.) manually operated by a human need to have sensor devices that accurately detect a force generated by a fingertip and a position of the fingertip.

General tactile sensors are classified into the following five types.

1. As sensors for contact (presence or absence of contact and check of approach), there are a limit switch, a pressure sensor, an optical sensor, a Hall element, a capacitance sensor, and the like.

2. As sensors for pressure sense (a pressure, a force, and a gripping force), there are a semiconductor pressure sensor, a strain gauge, a motor potential sensor, a spring displacement sensor, and the like.

3. As sensors for distribution tactile sense (a pressure distribution and a force distribution), there are a sensor including a pressure sensitive rubber and an electrode film, a sensor including a pressure sensitive polymeric film and an electrode plate, an optical sensor with a rubber plate, and an integrated semiconductor pressure sensor, and the like.

4. As sensors for slide sense (relative displacement, slide vibration, and shearing force), there are a sensor including a roller or a ball and an encoder, a vibration sensor, a three-dimensional tactile sensor, and the like.

5. As sensors for force sense (force and moment), there are a strain gauge with a structure, a strain block, an optical sensor with a spring, a drive force sensor, and the like.

As one of the tactile sensors, JP-A-2004-85548 discloses a measuring device that measures a characteristic from a deformation amount in order to measure a dynamical characteristic of a surface of a viscoelastic body such as a skin. JP-A-2004-273176 discloses a magnetic-particle dispersed film including magnetic particles arrayed in predetermined positions, which is suitably used in a pressure sensor.

SUMMARY OF THE INVENTION

As described above, there are the many types of tactile sensors. However, there are only a few tactile sensors that make it possible to grip and manipulate an arbitrary object using a robot hand or a manipulator and perform high-affinity physical interaction of the robot hand or the manipulator with a human. There is practically no tactile sensor that has softness optimum for griping and grippability generated by friction with the surface of the sensor in portions corresponding to a human fingertip and skin that grip the object.

Like a sensor that uses a pressure sensitive rubber and light, some tactile sensors make use of deformation of a partially soft material. However, the tactile sensors often have various problems and complicated structures and are expensive.

Therefore, it is desirable to make it possible to easily detect a static state and a dynamic state of an object that is in contact with a robot hand or a manipulator or physical interaction of the robot hand or the manipulator with a human.

According to an embodiment of the present invention, there is provided a detecting device including a viscoelastic magnet obtained by kneading and molding a magnet material and a viscoelastic material and magnetic-flux detecting means for detecting a change in a magnetic flux density vector due to deformation of the viscoelastic magnet.

The magnetic-flux detecting means can be formed of a magnetism detecting element that detects a change in the magnetic flux density vector on one axis in an XYZ coordinate system and converts the change into an output voltage.

The magnetism detecting element can be arranged such that the one axis is substantially parallel to a bias magnetization direction of the viscoelastic magnet.

A midpoint voltage of the output voltage from the magnetism detecting element can be set according to a direction of loading on the viscoelastic magnet and deformation of the viscoelastic magnet.

The detecting device can further include information detecting means for detecting information on a loading pressure on the viscoelastic magnet using the output voltage from the magnetism detecting element.

The magnetic-flux detecting means can be formed of magnetism detecting elements that detect changes in the magnetic flux density vector on two axes in an XYZ coordinate system and convert the changes into output voltages.

The magnetism detecting element that detects a change in the magnetic flux density vector on one axis of the two axes can be arranged such that the one axis is substantially parallel to a bias magnetization direction of the viscoelastic magnet. The magnetism detecting element that detects a change in the magnetic flux density vector on the other axis of the two axes can be arranged such that the other axis is substantially perpendicular to the one axis.

A midpoint voltage of the output voltage from the magnetism detecting element that detects a change in the magnetic flux density vector on the one axis can be set according to a direction of loading on the viscoelastic magnet and deformation of the viscoelastic magnet.

There can be two magnetism detecting elements that detect a change in the magnetic flux density vector on the other axis and the magnetism detecting elements can be arranged such that the center of the two magnetism detecting elements is located on the one axis.

The detecting device can further include information detecting means for detecting information on a loading pressure on the viscoelastic magnet and information on a loading center position using the output voltages from the magnetism detecting elements.

The magnetic-flux detecting means can be formed of magnetism detecting elements that detect changes in the magnetic flux density vector on three axes in an XYZ coordinate system and convert the changes into output voltages.

The magnetism detecting element that detects a change in the magnetic flux density vector on a first axis among the three axes can be arranged substantially parallel to a bias magnetization direction of the viscoelastic magnet. The magnetism detecting elements that detect changes in the magnetic flux density vector on a second axis and a third axis among the three axes can be arranged, respectively, such that, when the first axis is a z axis, the second axis and the third axis are an x axis and a y axis with respect to the z axis.

A midpoint voltage of the output voltage from the magnetism detecting element that detects a change in the magnetic flux density vector on the first axis can be set according to a direction of loading on the viscoelastic magnet and deformation of the viscoelastic magnet.

There can be two magnetism detecting elements that detect a change in the magnetic flux density vector on each of the second axis and the third axis and the magnetism detecting elements can be arranged such that the center of the two magnetism detecting elements is located on the first axis.

The detecting device can further include information detecting means for detecting information on a loading pressure on the viscoelastic magnet and information on a loading center position using the output voltages from the magnetism detecting elements.

A thin surface layer can be integrated with the viscoelastic magnet.

According to another embodiment of the present invention, there is provided a detecting method for a detecting device including magnetic-flux detecting means for detecting a change in a magnetic flux density vector, the detecting method including a step in which the magnetic-flux detecting means detects a change in the magnetic flux density vector due to deformation of a viscoelastic magnet obtained by kneading and molding a magnet material and a viscoelastic material.

According to the embodiments of the present invention, a change in a magnetic flux density vector due to deformation of a viscoelastic magnet obtained by kneading and molding a magnet material and a viscoelastic material is detected.

According to the embodiments of the present invention, it is possible to accurately grip and manipulate an arbitrary object using a robot hand or a manipulator and perform higher-affinity physical interaction of the robot hand or the manipulator with a human.

DESCRIPTION OF THE PREFERRED EMBODIMENTS

Figure 1:
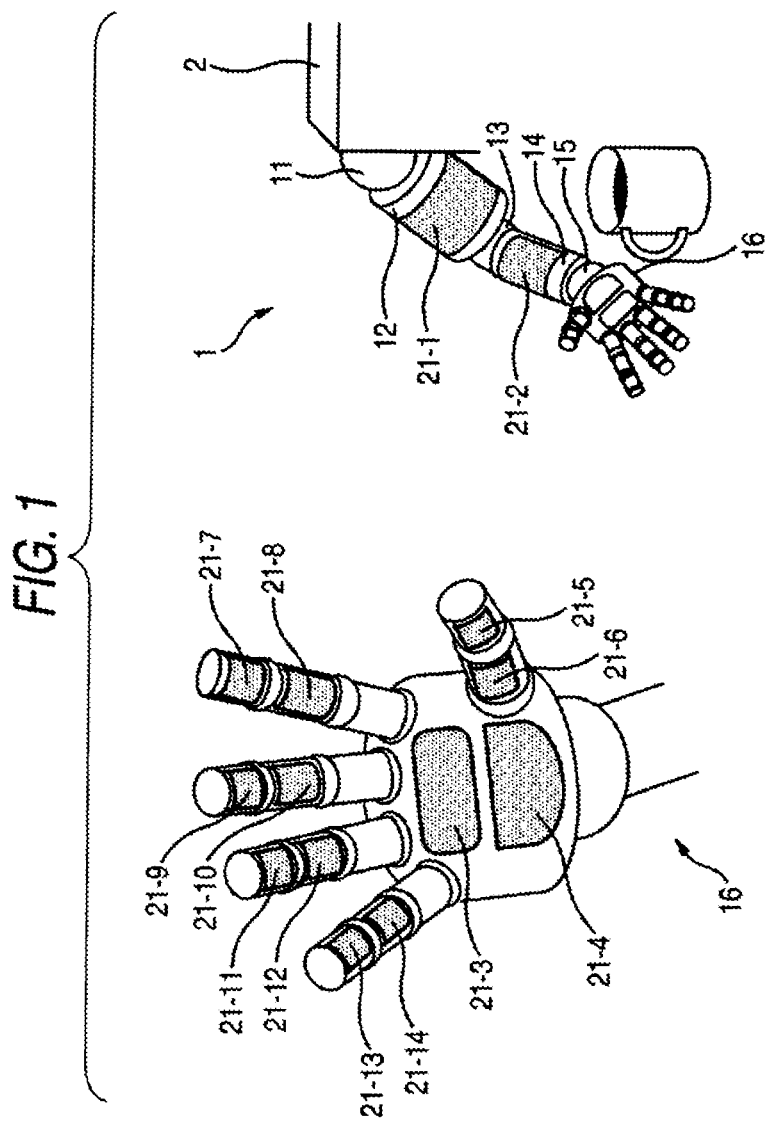
FIG. 1 is a diagram showing an example of an external structure of a robot hand manipulator according to an embodiment of the present invention.

Embodiments of the present invention will be hereinafter explained. A correspondence relation between elements of the present invention and the embodiments described or shown in the specification or the drawings is described as follows. This description is a description for confirming that the embodiments supporting the present invention are described or shown in the specification or the drawings. Therefore, even if there is an embodiment that is described or shown in the specification or the drawings but is not described herein as an embodiment corresponding to an element of the present invention, this does not mean that the embodiment does not correspond to the element. Conversely, even if an embodiment is described herein as an embodiment corresponding to an element of the present invention, this does not mean that the embodiment does not correspond to elements other than the element.

A detecting device (e.g., a sensor 21 in FIG. 3) according to an embodiment of the present invention includes a viscoelastic magnet (e.g., a stress-field converting section 41 in FIG. 3) obtained by kneading and molding a magnet material and a viscoelastic material and magnetic-flux detecting means (e.g., a magnetic-field detecting section 42 in FIG. 3) for detecting a change in a magnetic flux density vector due to deformation of the viscoelastic magnet.

The magnetic-flux detecting means can be formed of a magnetism detecting element (e.g., a Hall element 81z on a z axis in FIG. 13) that detects a change in the magnetic flux density vector on one axis in an XYZ coordinate system and converts the change into an output voltage.

The magnetism detecting element (e.g., the Hall element 81z on the z axis in FIG. 14) can be arranged such that the one axis is substantially parallel to a bias magnetization direction (e.g., a direction of a bias magnetic field B in FIG. 14) of the viscoelastic magnet.

The detecting device can further include information detecting means (e.g., a signal processing unit 112 in FIG. 15) for detecting information on a loading pressure on the viscoelastic magnet using the output voltage from the magnetism detecting element.

Figure 13:
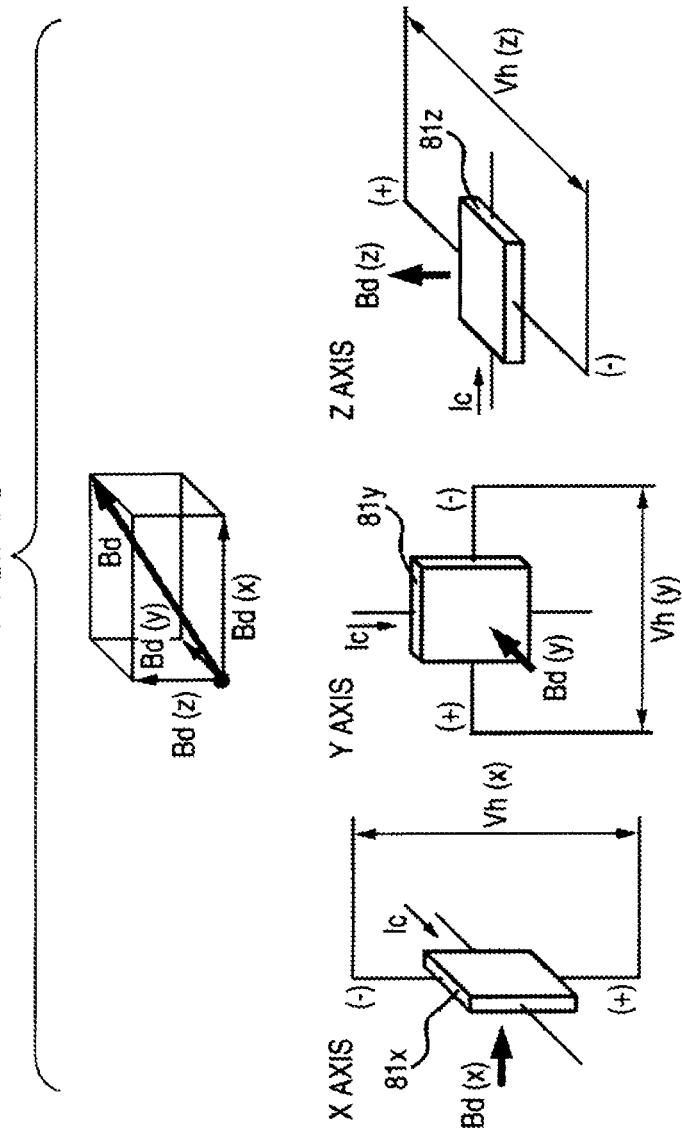
FIG. 13 is a diagram showing an example of Hall elements on three axes for detecting magnetic flux densities in three axis directions.

The magnetic-flux detecting means can be formed of magnetism detecting elements (e.g., a Hall element 81x on an x axis and a Hall element 81z on a z axis in FIG. 13) that detect changes in the magnetic flux density vector on two axes in an XYZ coordinate system and convert the changes into output voltages.

The magnetism detecting element (e.g., the Hall element 81z on the z axis in FIG. 14) that detects a change in the magnetic flux density vector on one axis of the two axes can be arranged such that the one axis is substantially parallel to a bias magnetization direction (e.g., a direction of a bias magnetic field B in FIG. 14) of the viscoelastic magnet. The magnetism detecting element (e.g., a Hall element 81x1 on an x axis in FIG. 14) that detects a change in the magnetic flux density vector on the other axis of the two axes can be arranged such that the other axis is substantially perpendicular to the one axis.

There can be two magnetism detecting elements (e.g., Hall elements 81x1 and 81x2 on the x axis in FIG. 14) that detect a change in the magnetic flux density vector on the other axis and the magnetism detecting elements can be arranged such that the center of the two magnetism detecting elements is located on the one axis.

The detecting device can further include information detecting means (e.g., a signal processing unit 112 in FIG. 15) for detecting information on a loading pressure on the viscoelastic magnet and information on a loading center position using the output voltages from the magnetism detecting elements.

The magnetic-flux detecting means can be formed of magnetism detecting elements (e.g., a Hall element 81x on an x axis, a Hall element 81y on a y axis, and a Hall element 81z on a z axis in FIG. 13) that detect changes in the magnetic flux density vector on three axes in an XYZ coordinate system and convert the changes into output voltages.

The magnetism detecting element (e.g., the Hall element 81z on the z axis in FIG. 14) that detects a change in the magnetic flux density vector on a first axis among the three axes can be arranged substantially parallel to a bias magnetization direction (e.g., a direction of a bias magnetic field B in FIG. 14) of the viscoelastic magnet. The magnetism detecting elements (e.g., the Hall element 81x1 on the x axis and the Hall element 81y1 on the y axis in FIG. 14) that detect changes in the magnetic flux density vector on a second axis and a third axis among the three axes can be arranged, respectively, such that, when the first axis is a z axis, the second axis and the third axis are an x axis and a y axis with respect to the z axis.

Figure 14:
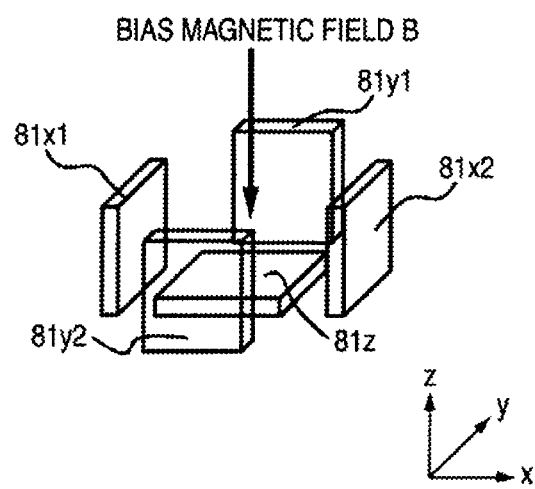
FIG. 14 is a diagram showing an example of an arrangement on a circuit board of the Hall elements on the three axes with respect to a bias magnetic field.

There can be two magnetism detecting elements (e.g., Hall elements 81x1 and 81x2 on the x axis or Hall elements 81y1 and 81y2 on the y axis in FIG. 14) that detect a change in the magnetic flux density vector on each of the second axis and the third axis and the magnetism detecting elements can be arranged such that the center of the two magnetism detecting elements is located on the first axis.

The detecting device can further include information detecting means (e.g., a signal processing unit 112 in FIG. 15) for detecting information on a loading pressure on the viscoelastic magnet and, information on a loading center position using the output voltages from the magnetism detecting elements.

A thin surface layer (e.g., a silicon rubber 64 in FIG. 6) can be integrated with the viscoelastic magnet.

A detecting method according to another embodiment of the present invention is a detecting method for a detecting device including magnetic-flux detecting means for detecting a change in a magnetic flux density vector, the detecting method including a step (e.g., step S13 in FIG. 19) in which the magnetic-flux detecting means detects a change in the magnetic flux density vector due to deformation of a viscoelastic magnet obtained by kneading and molding a magnet material and a viscoelastic material.

Embodiments of the present invention will be hereinafter explained with reference to the accompanying drawings.

FIG. 1 is a diagram showing an example of an external structure of a robot hand manipulator according to an embodiment of the present invention.

The robot hand manipulator includes a robot hand 1 including a shoulder joint section 11, an upper arm section 12, an elbow joint section 13, a forearm section 14, a wrist section 15, and a hand section 16 and a supporting unit 2 that supports the robot hand 1 via the shoulder joint section 11 of the robot hand 1.

Sensors 21-1 and 21-2 are provided on inner sides of the upper arm section 12 and the forearm section 14 of the robot hand 1, respectively. As shown in enlargement on the left side in FIG. 1, sensors 21-3 and 21-4 are provided in a palm forming the hand section 16 of the robot hand 1. A sensor 21-5 is provided above a first joint on a finger palm surface of a thumb forming the hand section 16. A sensor 21-6 is provided between the first joint and a second joint on the finger palm surface of the thumb. A sensor 21-7 is provided above a first joint on a finger palm surface of an index finger. A sensor 21-8 is provided between the first joint and a second joint on the finger palm surface of the index finger.

A sensor 21-9 is provided above a first joint on a finger palm surface of a middle finger. A sensor 21-10 is provided between the first joint and a second joint on the finger palm surface of the middle finger. A sensor 21-11 is provided above a first joint on a finger palm surface of a third finger. A sensor 21-12 is provided between the first joint and a second joint on the finger palm surface of the third finger. A sensor 21-13 is provided above a first joint on a finger palm surface of a little finger. A sensor 21-14 is provided between the first joint and a second joint on the finger palm surface of the little finger.

When it is unnecessary to specifically distinguish the sensors 21-1 to 21-14 from one another, the sensors 21-1 to 21-14 are simply referred to as a sensor(s) 21 in the following explanation.

The robot hand manipulator actuates actuators built in respective joint sections such as the shoulder joint section 11, the elbow joint section 13, the wrist section 15, and the finger joint sections of the hand section 16 to bring the respective sensors 21 of the hand section 16 and the like into contact with an arbitrary object such as a mug shown in FIG. 1.

The respective sensors 21 provided in the robot hand 1 are formed of magnetic materials having softness like a human skin and having friction on the surfaces thereof. The magnetic materials are deformed into various shapes according to a force from the outside and a form of the force. According to the deformation, the magnetic materials change bias magnetic fluxes initially given to the magnetic materials. The changes in the bias magnetic fluxes are detected as changes in voltages from changes in magnitudes of magnetic flux densities and directions of the bias magnetic fluxes and are converted into information. Consequently, a static state (if an object is moving, a dynamic behavior) of the mug, which is in contact with the robot hand manipulator, is detected as a grip state of the object.

The robot hand manipulator actuates, on the basis of the detected grip state of the object, the actuators of the respective joint sections using the softness of the sensors 21 themselves and grippability generated by the surface friction to grip the mug and move and carry the mug.

As described above, the robot hand manipulator can dexterously grip and manipulate arbitrary objects having various sizes, shapes, surface states, weights, and the like.

Figure 2:
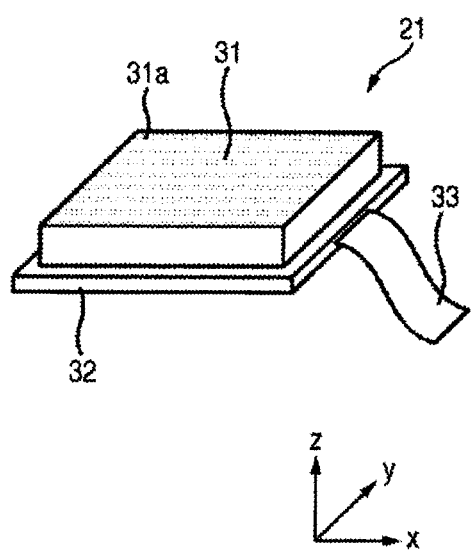
FIG. 2 is a perspective view showing an example of an external structure of a sensor in FIG. 1.

FIG. 2 is a perspective view showing an example of an external structure of a sensor according to the embodiment.

The sensor 21 roughly includes an input section 31 touched by an object, a human finger, and the like, a fixing section 32 that supports the input section 31 formed of a deformable material, and an external connection section 33 through which power is inputted and a detection result of the sensor 21 is outputted to, for example, a main control unit 101 (FIG. 15 described later) of the robot hand manipulator.

In the example in FIG. 2, in the input section 31, an input plane 31*a* is formed in a square pole shape. In the following explanation, the input plane 31*a* is an xy plane and a direction perpendicular to the input plane 31*a* is a z axis direction unless specifically noted otherwise.

Figure 3:
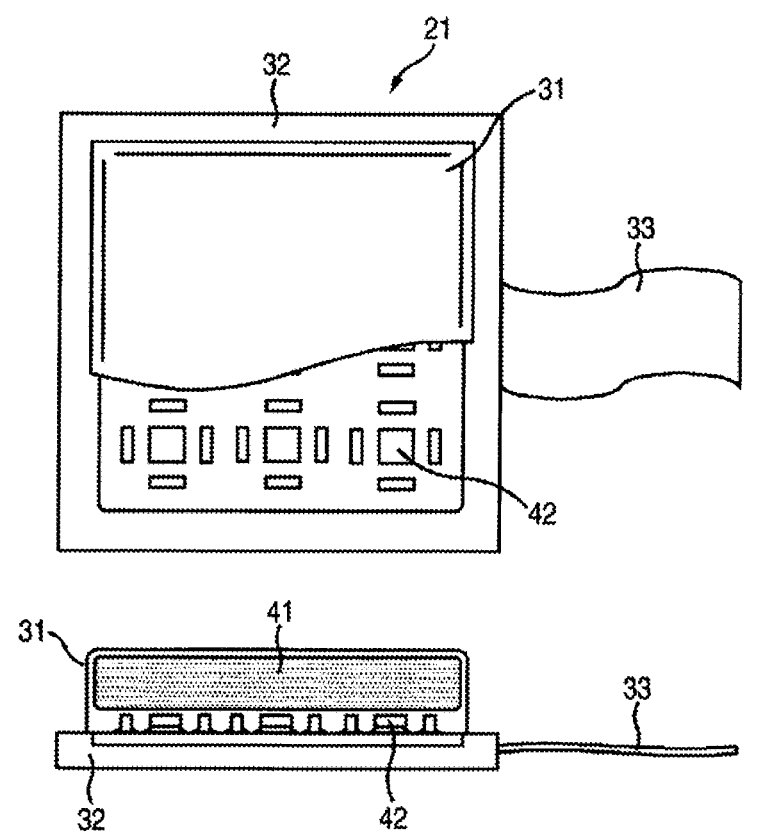
FIG. 3 is a diagram showing an example of an internal structure of the sensor in FIG. 2.

FIG. 3 is a diagram showing an example of an internal structure of the sensor 21 in FIG. 2. In the upper part in the figure, a plan view of the sensor 21 viewed from above is shown. In the lower part in the figure, a side sectional view of the sensor 21 viewed from a side is shown.

The input section 31 roughly includes a stress-field converting section 41 and a magnetic-field detecting section 42. In the plan view in FIG. 3, for convenience of explanation, the stress-field converting section 41 is omitted.

The stress-field converting section 41 is formed of a composite material of a viscoelastic material such as a silicon gel material and rare-earth magnetic powder (hereinafter also referred to as viscoelastic magnet). The stress-field converting section 41 is easily deformed by the load from the outside. The magnetic-field detecting section 42 includes a circuit board on which one or more magnetoelectric elements such as Hall elements are arranged. The magnetic-field detecting section 42 detects a magnetic flux generated from the surface of the stress-field converting section 41 adjacent thereto and outputs a voltage.

Figure 4:
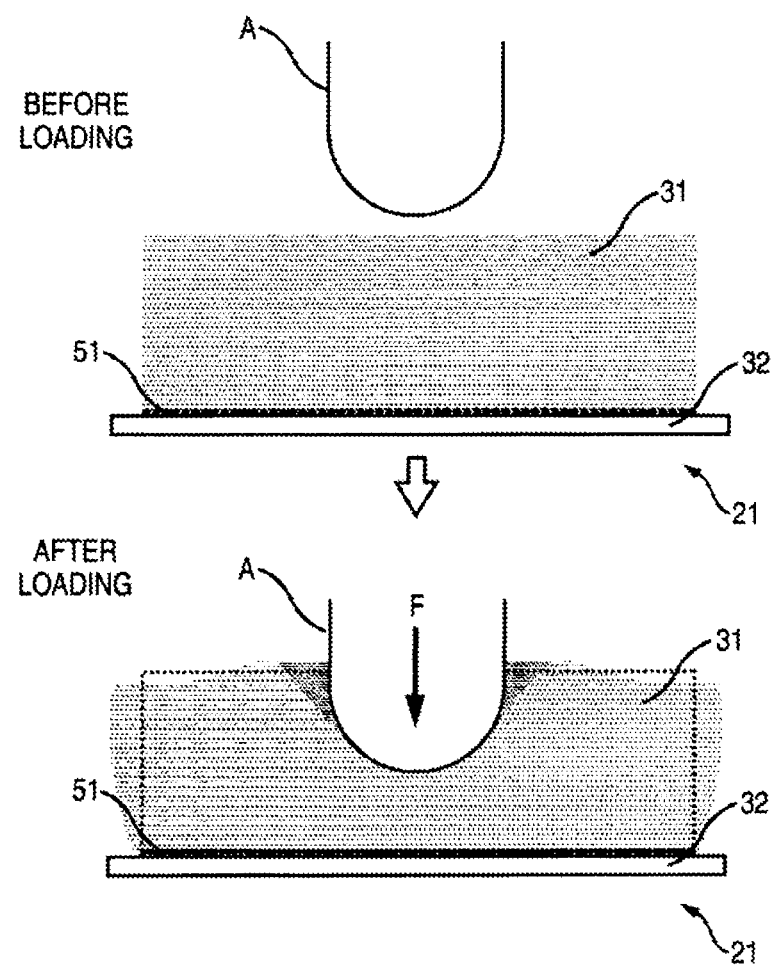
FIG. 4 is a diagram for explaining shapes of an input section before loading and after loading.

FIG. 4 is a diagram showing an example of shapes of the input section 31 before loading and after loading. As described above, the stress-field converting section 41 constituting the input section 31 is formed of the viscoelastic material in which elastomer having viscoelasticity is used as a binder. Therefore, the input section 31 can be easily deformed into various shapes by the load from the outside. Silicon gel having high heat resistance, cold resistance, slidability, and abrasive resistance is suitable for the viscoelastic material. However, other materials can also be used.

A boundary between the input section 31 and the fixing section 32 is formed as a binding surface 51. The input section 31 and the fixing section 32 are fixed by bonding or integral molding via the binding surface 51. According to an experiment by the applicant, when a load F is applied to the input section. 31 by the depression of the input section 31 by a finger A or the like, because of incompressibility equivalent to that of a rubber material, in the input section 31 after loading, a so-called bulging phenomenon in which a part of the sides and the upper surface expands from an original shape indicated by a dotted line is generated. A shape of the input section 31 represents various characteristics according to a load value and an input shape.

Figure 5:
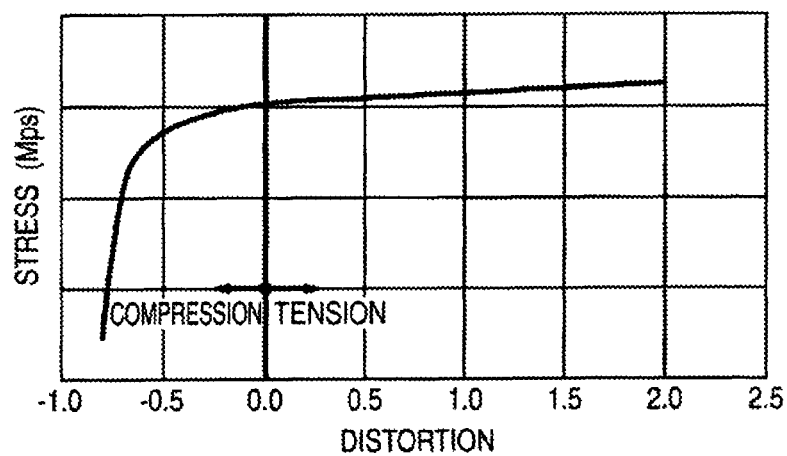
FIG. 5 is a graph showing an example of compression and tension characteristics of a viscoelastic material.

FIG. 5 is a graph showing an example of compression and tension characteristics of the viscoelastic material.

The ordinate represents a stress [Mpa] generated against the load (an external force) acting on the viscoelastic material. The abscissa represents distortion, which is a degree of deformation due to the load on the material with respect to an original state.

A position where the distortion is 0.0 (i.e., a position where distortion does not occur) represents a state in which the external force does not act on the viscoelastic material. When the load of compression is applied to the viscoelastic material, the distortion only changes to a position around −0.8 from the position of 0.0. A generated stress gradually increases in a minus direction (a downward direction in the figure) until the distortion reaches a position around −0.5. From a position where the distortion exceeds −0.6 to a position around −0.8, the stress sharply increases.

When a load of tension is applied to the viscoelastic material, the distortion changes to a position around 2.0 from the position of 0.0. A generated stress increases in a plus direction (an upward direction in the figure) gently compared with the increase in the stress in the case of compression until the distortion reaches a position around 2.0.

As described above, when the distortion with respect to the load of compression in the viscoelastic material exceeds a fixed degree, the distortion does not increase exceeding the degree. Instead, the stress in the minus direction increases. In other words, there is a close relation between the distortion (i.e., deformation) of the viscoelastic material and the stress.

A material forming the input section 31 will be explained in detail with reference to FIG. 6.

Figure 6:
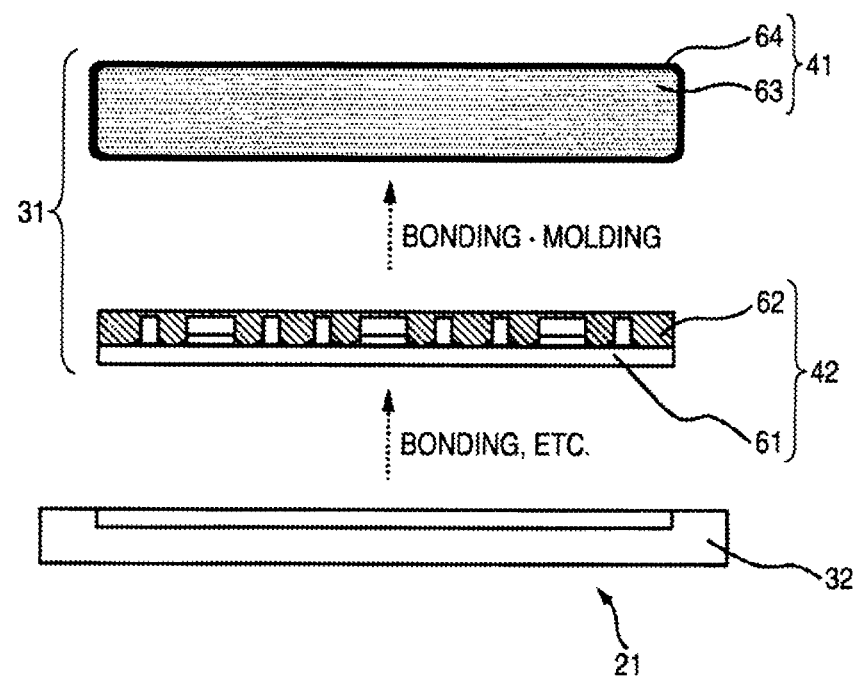
FIG. 6 is a diagram for explaining a material forming the input section.

In an example in FIG. 6, the magnetic-field detecting section 42 includes a circuit board 61 on which one or more magnetoelectric elements such as Hall elements are arranged and molded with resin 62 or the like. The magnetic-field detecting section 42 is bonded and fixed on the fixing section 32.

The stress-field converting section 41 is bonded on the circuit board 61 molded with the resin 62. In the example in FIG. 6, the stress-field converting section 41 includes a viscoelastic magnet 63 obtained by kneading and molding a general magnet material and a viscoelastic material having viscoelasticity and thin-film silicon rubber 64 integrated with the viscoelastic magnet 63 by the two-color molding.

As the magnet material, for example, rare earth such as neodium and samarium or a magnetic powder material such as ferrite is used. As the viscoelastic material, silicon, polyurethane, or the like is used.

In general, the viscoelastic material has higher adhesiveness of the surface as the viscoelastic material is softer. Therefore, when grip of an object and contact with a human are assumed, it is necessary to modify the viscoelastic material with coating or powder treatment to reduce friction. However, with these modification methods, the viscoelastic material has low durability and it is highly likely that a surface state thereof changes according to an environment of use. Therefore, depending on a modification method, it is likely that unevenness occurs on the surface and a positional characteristic difference on the surface of the sensor 21 occurs.

To cope with such a problem, as shown in FIG. 6, the thin-film silicon rubber 64 is integrated with the surface of the viscoelastic magnet 63 to constitute the stress-field converting section 41. This makes it possible to improve durability and control friction without spoiling softness of silicon gel in the inside (i.e., the viscoelastic magnet 63) using the thin-film silicon rubber 64 on the surface.

Figure 7:
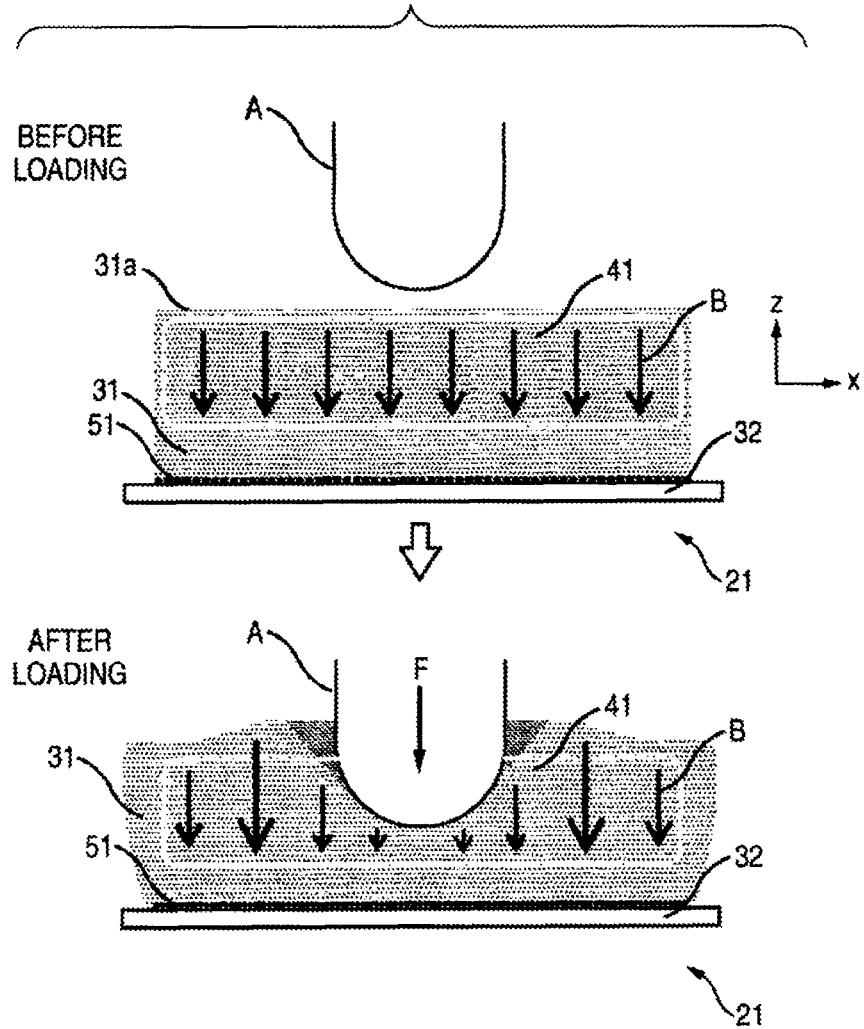
FIG. 7 is a diagram showing an example of bias magnetic fields applied to a stress-field converting section before loading and after loading.

FIG. 7 is a diagram showing an example of bias magnetic fields applied to the stress-field converting section 41 before loading and after loading. Actually, the stress-field converting section 41 indicated by a white dotted line is deformed after loading in the same manner as the input section 31. However, for convenience of explanation, the stress-field converting section 41 after loading is shown in a shape same as that before loading.

As described above with reference to FIG. 3, the stress-field converting section 41 includes an isotropic rare earth magnet (i.e., the viscoelastic magnet 63) having viscoelasticity kneaded and molded with elastomer as a binder. The rare earth magnet can be anisotropic. As indicated by an arrow before loading, bias magnetic fields B are applied to the stress-field converting section 41 after molding in a z axis direction (a direction perpendicular to the input plane 31a) by magnetization (polarization) in advance.

On the other hand, after loading of the load F by the depression of the input section 31 by the finger A or the like, strengths of the bias magnetic fields B aligned in the z axis direction before loading are varied (disarranged) by the deformation of the stress-field converting section 41 and change to a magnetic field corresponding to the thickness of the material. In other words, as indicated by sizes of arrows after loading, the bias magnetic fields B in portions expanded by the occurrence of the bulging phenomenon are stronger than that before loading and the bias magnetic fields B in portions compressed by the load F are weaker than that before loading.

This is because, as the thickness of the stress-field converting section 41 (i.e., the rare earth magnet) changes, demagnetizing fields in the magnet change. The demagnetizing fields in the magnet increase in thinner portions and a magnetic flux density generated on the not-shown outside of the magnet decreases. In other words, the stress-field converting section 41 has a correlation with the magnetic flux density.

As described above with reference to FIG. 5, the stress generated in the magnet by the load F of the object has a correlation with deformation of the stress-field converting section 41 (i.e., the viscoelastic material). Therefore, it is seen that a magnetic flux density vector generated on the outside of the magnet has a close correlation with the stress generated in the magnet by the load F of the object.

In the example in FIG. 7, the bias magnetic fields B are applied in substantially the z axis direction. However, a direction, in which the bias magnetic fields B are applied is not limited to the z axis direction. The bias magnetic fields B can be applied in different directions (e.g., directions tilted 45 degrees and 90 degrees with respect to the z axis direction) according to shapes of various magnets, an arrangement of a sensor that detects a magnetic flux density generated on the outside of the magnet, and the like.

A surface magnetic flux density on a magnetic field detection surface of the magnetic-field detecting section 42 will be explained with reference to FIGS. 8 and 9.

Figure 8:
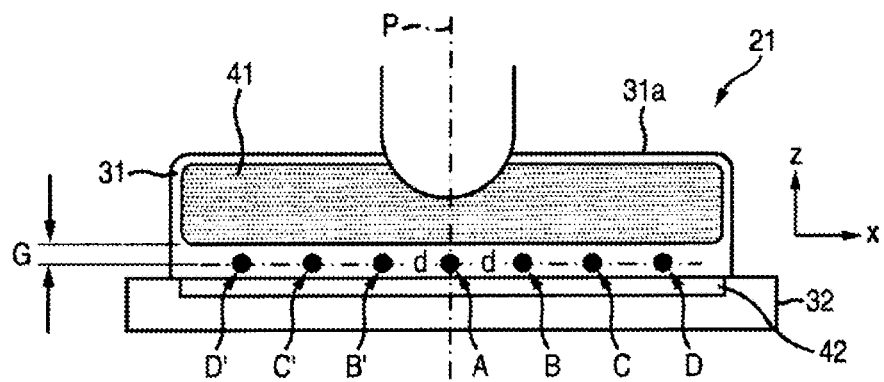
FIG. 8 is a diagram for explaining surface magnetic flux densities at respective measurement points on an x axis.

FIG. 8 is a diagram showing a side sectional view of the sensor 21. In an example in FIG. 8, magnetic fluxes are detected by the magnetic-field detecting section 42 on a magnetic flux detection surface, which is a surface a predetermined distance G (gap) apart from the stress-field converting section 41 downward. An x axis (in a horizontal direction in the figure) and a z axis (a vertical direction in the figure) are shown among xyz axes of an XYZ coordinate system having an origin at an intersection point of the magnetic flux detection surface and a perpendicular passing substantially the center position of the input plane (the xy plane) 31a.

On the magnetic flux detection surface, from the left in the figure, magnetic flux detection points D', C', B', A, B, C, and D are shown. These magnetic flux detection points are located side by side on the magnetic flux detection surface (i.e., the x axis) a distance G apart from the stress-field converting section 41. The magnetic-field detecting section 42 detects surface magnetic flux densities generated on the outside of the stress-field converting section 41 at the respective magnetic flux detection points D', C', B', A, B, C and D.

The magnetic flux detection point A is located in substantially the center position on the x axis (i.e., the origin in FIG. 8). The magnetic flux detection points B' and B are located in symmetrical positions on the x axis a distance d apart from the magnetic flux detection point A, respectively. The magnetic flux detection points C' and C are located in symmetrical positions on the x axis a distance twice as large as the distance d apart from the magnetic flux detection point A, respectively. The magnetic flux detection points D' and D are located in symmetrical positions on the x axis a distance three times as larger as the distance d apart from the magnetic flux detection point A, respectively.

For example, the load is applied to the input section 31 with the magnetic flux detection point A, which is a substantial center position on the x axis, set as the loading center P.

Figure 9:
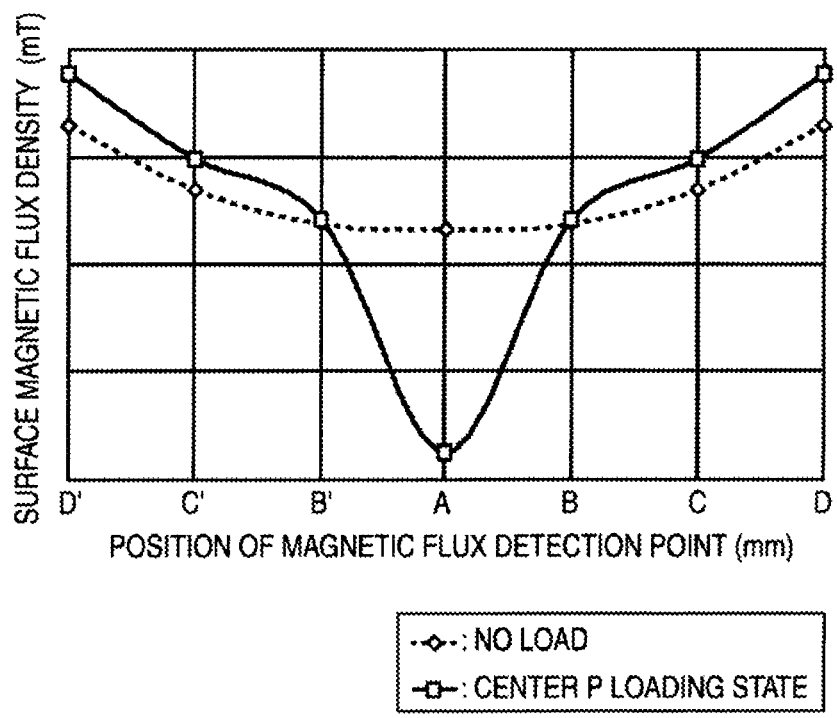
FIG. 9 is a graph for explaining the surface magnetic flux densities at the respective measurement points on the x axis.

FIG. 9 is a graph showing an example of a surface magnetic flux densities in the z axis direction detected at the respective magnetic flux detection points in FIG. 8. In the example in FIG. 9, the ordinate represents a surface magnetic flux density [mT] in the z axis direction and the abscissa represents positions of the respective magnetic flux detection points with the magnetic flux detection point A set as the center (i.e., distances from the loading center P to the respective magnetic flux detection points D', C', B', A, B, C, and D in FIG. 8). A dotted line and a solid line indicate surface magnetic flux densities in the z axis direction before loading and after loading detected at the respective magnetic flux detection points in FIG. 8, respectively.

As indicated by the dotted line, the surface magnetic flux densities in the z axis direction before loading decrease toward the magnetic flux detection point A in the substantial center position of the stress-field converting section 41 because of a general characteristic due to a magnet shape (a sectional shape and a length). In other words, the magnetic flux density detected at the magnetic flux detection point A is the smallest.

On the other hand, as indicated by the solid line, the surface magnetic flux densities in the z axis direction after loading with the magnetic flux detection point A set as the loading center P are smaller near the loading center P (i.e., the magnetic flux detection point A). Conversely, on the outer side the distance d or more apart from the magnetic flux detection point A (i.e., the magnetic flux detection points D', C', B', B, C, and D), the magnetic flux densities are larger than those in the case of no load (the dotted line).

In other words, the magnetic flux densities near the loading center P, where the thickness is reduced by the load and the demagnetizing field in the magnet is large, are small and the magnetic flux densities near the outer side, where the thickness is increased by the occurrence of the bulging phenomenon and the demagnetizing field in the magnet is small, are large.

As described above, the surface magnetic flux densities in the z axis direction have a close relation with a direction and a magnitude (a vector) of a stress generated in the material (the stress-field converting section 41) by the load. In the example in FIG. 9, only the surface magnetic flux densities in the z axis direction measured at the respective magnetic flux detection points on the x axis are shown. Next, an example in which measurement points are expanded two dimensionally (on the xy plane) from the measurement points on the x axis in the example in FIG. 9 and surface magnetic flux densities in the z axis direction are measured will be explained.

Figure 10:
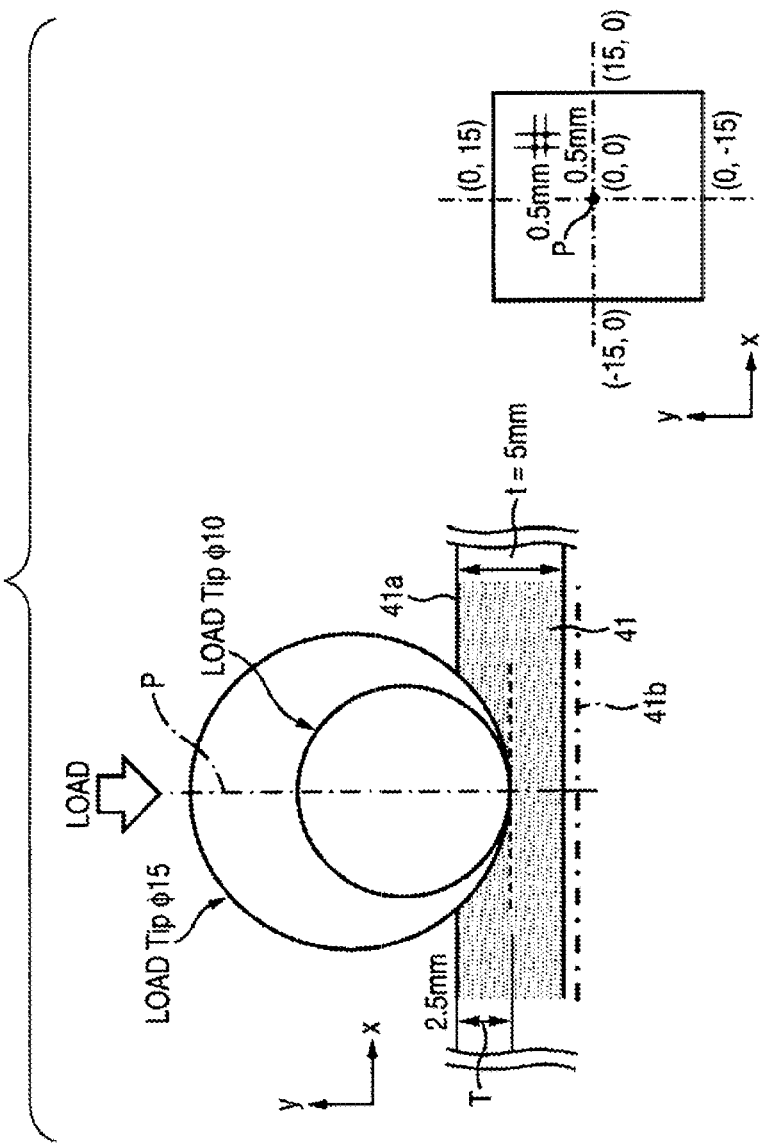
FIG. 10 is a diagram for explaining measurement of surface magnetic flux densities at respective measurement points on an xy plane.

As shown in FIG. 10, the applicant expanded the measurement points two dimensionally (on the xy plane) from those in the example in FIG. 9 (i.e., the measurement points on the x axis) and measured surface magnetic flux densities in the z axis direction of the viscoelastic magnet constituting the stress-field converting section 41. On the left side in FIG. 10, the stress-field converting section 41 viewed from a side is shown. On the right side in FIG. 10, the stress-field converting section 41 viewed from right above is shown.

As shown on the left side, the load is applied to the xy plane (a loading surface 41a) of the stress-field converting section 41 including a viscoelastic magnet having the thickness t=5 mm with the center in the loading surface 41a set as the loading center P with a Tip of φ10 mm or φ15 mm until a depression depth T reaches 2.5 mm. The Tip is a tool formed of a hard material (resin or metal; non magnetic material) and having a sphere R at the tip thereof. The Tip of φ10 mm indicates that a diameter of a circle at the tip of the Tip is 10 mm, i.e., when the load is applied by the Tip, a diameter of a circle forming a circumference in contact with the stress-field converting section 41 is 10 mm.

At the respective measurement points on a magnetic flux density measurement surface b located on the opposite side of the loading surface 41a across the stress-field converting section 41, surface magnetic flux densities in the z axis direction are measured when there is no Tip (no load), when the load is applied by the Tip of φ10 mm, and when the load is applied by the Tip of φ15 mm. In this case, as indicated by the loading surface 41a on the right side in the figure, the surface magnetic flux densities in the z axis direction are measured at 3,721 measurement points present at intervals of 0.5 mm in a range of −15 mm to 15 mm in each of the x direction and the y direction with respect to the loading center P, which is the center (0,0) on the loading surface 41a.

Figure 11:
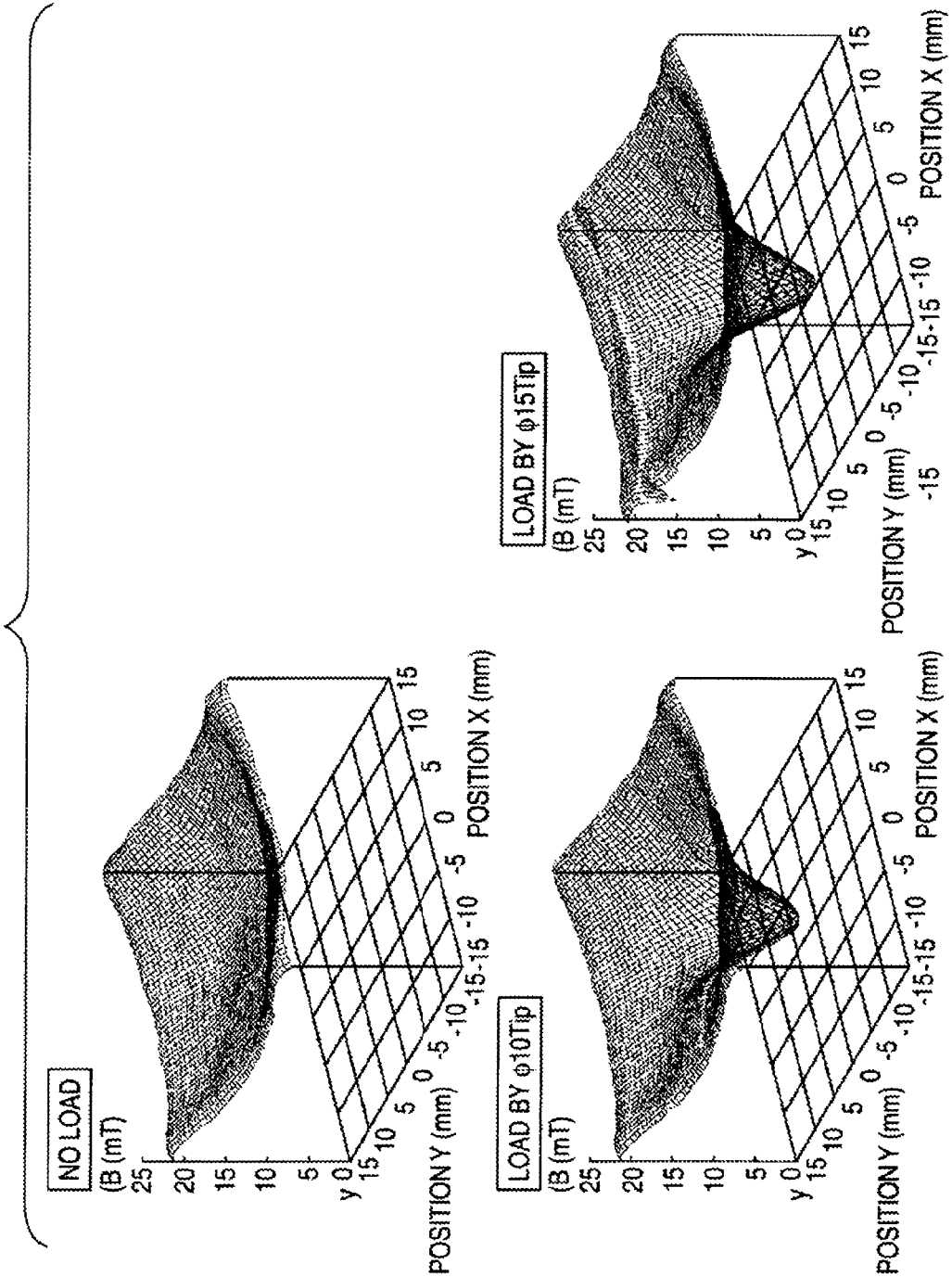
FIG. 11 is a diagram showing an example of a graph of the surface magnetic flux densities at the respective measurement points on the xy plane.
Figure 12:
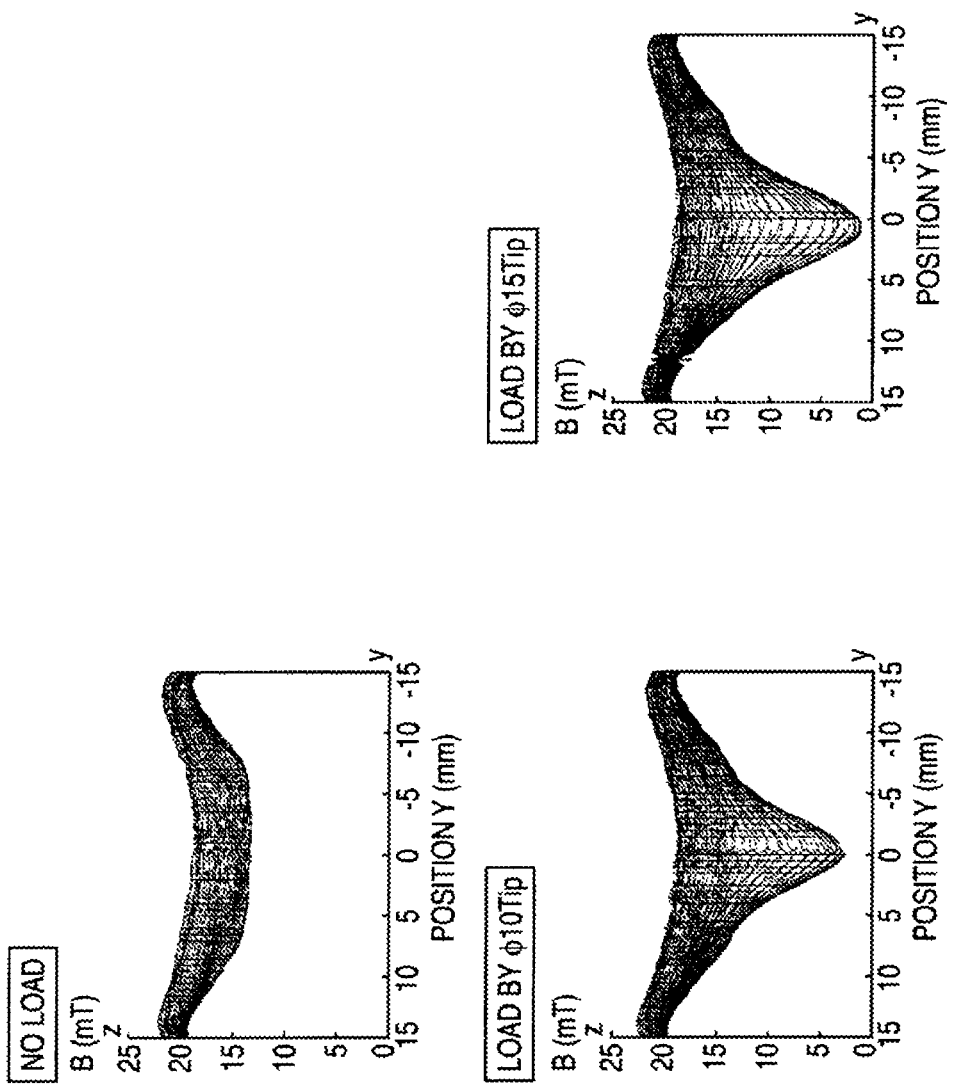
FIG. 12 is a diagram showing another example of the graph of the surface magnetic flux densities at the respective measurement points of three axes on the xy plane.

All data measured when there is no load, when the load is applied by the Tip of φ10 mm, and when the load is applied by the Tip of φ15 mm as described above are visualized in a form of graphs as shown in FIGS. 11 and 12. In the graphs, an x axis and a y axis represents a position (x, y) of a measurement point, respectively and a z axis represents a value B [mT] of a surface magnetic flux density in the z axis direction measured in the position.

In FIG. 11, in order to grasp all the surface magnetic flux densities in the z axis direction, the graphs are represented as bird's-eye views. In FIG. 12, in order to grasp differences in changes of the surface magnetic flux densities in the z axis direction with respect to sizes of the Tip, changes in the surface magnetic flux densities in the z axis direction with respect to positions in the y direction are represented as graphs.

As shown in the graphs in FIGS. 11 and 12, even when the surface magnetic flux densities in the z axis direction in the case of no load are measured at measurement points expanded two-dimensionally (on the xy plane), the surface magnetic flux densities decrease toward the substantial center position of the loading surface 41a set as the loading center P because of a general characteristic due to a magnet shape (a sectional shape and a length).

On the other hand, even when the surface magnetic flux densities in the z axis direction at the time when the loads by the Tips of φ10 mm and φ15 mm are applied are measured at measurement points expanded two-dimensionally (on the xy plane), the magnetic flux densities near the loading center P are smaller. Conversely, magnetic flux densities near the outer side most distant from the loading center P are slightly larger than those in the case of no load. In other words, even when the measurement points are expanded two-dimensionally (on the xy plane) from those in the example in FIG. 9 and the surface magnetic flux densities in the z axis direction are measured, the magnetic flux densities in the z axis direction near the loading center P, where the thickness is reduced by the load and the demagnetizing field in the magnet is large, are small. The magnetic flux densities in the z axis direction near the outer side, where the thickness is increased by the occurrence of the bulging phenomenon and the demagnetizing field in the magnet is small, are slightly large.

The surface magnetic flux densities in the z axis direction is smaller near the loading center P with the loading center P set as the center when the load is applied by the Tip of φ15 mm than when the load is applied by the Tip of φ10 mm. In other words, when a contact area on which the load is applied in the loading plane 41a is larger, the surface magnetic flux densities in the z axis direction near the loading center P are smaller.

As described above, it is seen that the surface magnetic flux densities in the z axis direction measured at the measurement points expanded two-dimensionally (on the xy plane) has a close relation with not only a direction and a magnitude (a vector) of a stress generated in the material (the stress-field converting section 41) by the load but also a size of the contact area on which the load is applied.

FIG. 13 is a diagram of an example of Hall elements on three axes for detecting magnetic flux densities in three axis directions.

In the example in FIG. 13, a magnetic flux Bd(x), a magnetic flux Bd(y), and a magnetic flux Bd(z) obtained by resolving a magnetic flux density vector (hereinafter simply referred to as magnetic flux as well) Bd in three axis directions of an x axis, a y axis, and a z axis are shown. When a Hall current Ic is fed to a Hall element 81x that catches the magnetic flux Bd(x) on the x axis (hereinafter referred to as Hall element 81x on the x axis), the Hall element 81x catches the magnetic flux Bd(x) from the vertical direction and generates a Hall voltage Vh(x) in directions perpendicular to a current direction and a magnetic field direction. In other words, the Hall element 81x can catch the magnetic flux Bd(x) and convert the magnetic flux Bd(x) into the Hall voltage Vh(x).

Similarly, when the Hall current Ic is fed to a Hall element 81y that catches the magnetic flux Bd(y) on the y axis (hereinafter referred to as Hall element 81y on the y axis), the Hall element 81y catches the magnetic flux Bd(y) from the vertical direction and generates a Hall voltage Vh(y) in directions perpendicular to a current direction and a magnetic field direction, respectively. In other words, the Hall element 81y can catch the magnetic flux Bd(y) and convert the magnetic flux Bd(y) into the Hall voltage Vh(y). When the Hall current Ic is fed to a Hall element 81z that catches the magnetic flux Bd(z) on the z axis (hereinafter referred to as Hall element 81z on the z axis), the Hall element 81z catches the magnetic flux Bd(z) from the vertical direction and generates a Hall voltage Vh(z) in directions perpendicular to a current direction and a magnetic field direction, respectively. In other words, the Hall element 81z can catch the magnetic flux Bd(z) and convert the magnetic flux Bd(z) into the Hall voltage Vh(z).

In the following explanation, when it is unnecessary to specifically distinguish the Hall elements 81x, 81y, and 81z from one another, the Hall elements 81x, 81y, and 81z are simply referred to as a Hall element(s) 81.

FIG. 14 is a diagram of an example of an arrangement of Hall elements on three axes on the circuit board 61 with respect to the bias magnetic field B applied in the z axis direction.

In the example in FIG. 14, a Hall element group 91 including Hall elements 81x1 and 81x2 on the x axis, Hall elements 81y1 and 81y2 on the y axis, and the Hall element 81z on the z axis is shown. In the Hall element group 91, the two Hall elements 81x1 and 81x2 and the two Hall elements 81y1 and 81y2 are used for the x axis and the y axis, respectively.

The Hall element 81z on the z axis is arranged such that a magnetic flux Bd(z) on the z axis caught by the Hall element 81z is substantially parallel to a direction in which the bias magnetic field B is applied. In other words, the Hall element 81z on the z axis is arranged perpendicularly to the bias magnetic field B applied in the z axis direction. The Hall elements 81x1 and 81x2 on the x axis are arranged such that the center of the Hall elements 81x1 and 81x2 is located on the z axis to use the Hall elements 81x1 and 81x2 in differential amplification (a differential amplification unit 14 in FIG. 16). The Hall elements 81y1 and 81y2 on the y axis are arranged such that the center of the Hall elements 81y1 and 81y2 is located on the z axis to use the Hall elements 81y1 and 81y2 in differential amplification.

As the Hall element group 91, other than forming the Hall element group 91 with the five uniaxial type Hall elements 81 as shown in FIG. 14, a Hall element group including five Hall elements 81 formed as a unit in one semiconductor can also be used. Further, a Hall element group of a composite type including some of the five Hall elements 81 formed as a unit and the remaining Hall elements 81 formed as uniaxial type Hall elements can also be used.

Figure 15:
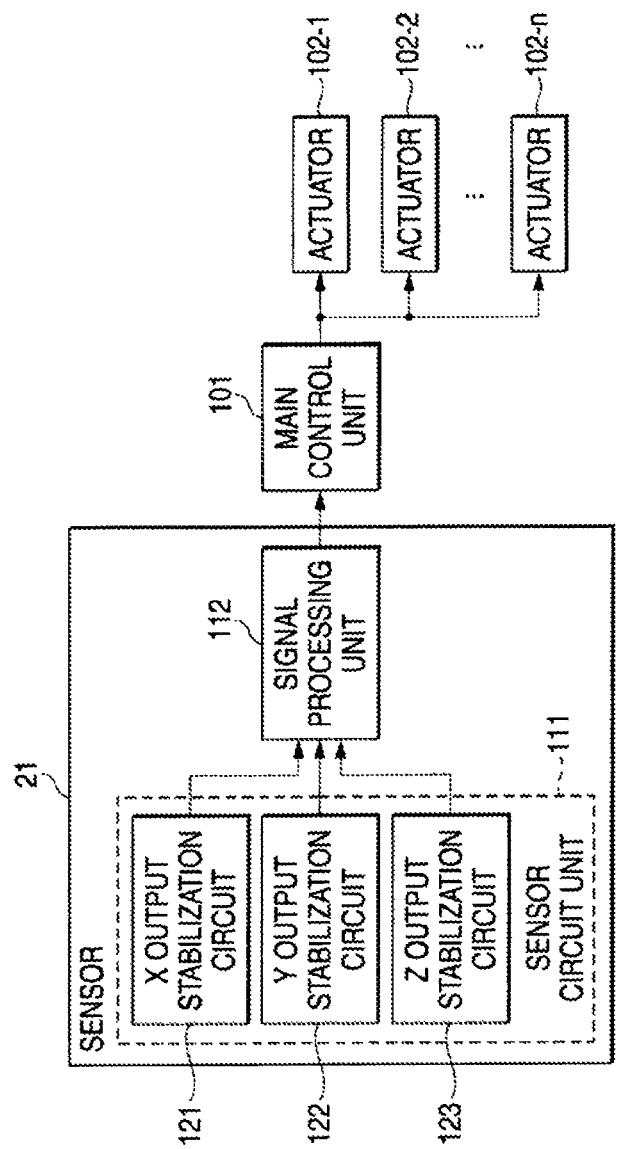
FIG. 15 is a block diagram showing an example of an internal electric structure of the robot hand manipulator.

FIG. 15 is a diagram showing an example of an electric structure in the robot hand manipulator in FIG. 1.

In the example in FIG. 15, the robot hand manipulator includes a main control unit 101, actuators 102-1 to 102-n, and plural sensors 21.

The main control unit 101 has a CPU (Central Processing Unit), a memory, and the like built therein. When the CPU executes a control program stored in the memory, the main control unit 101 performs various kinds of processing. The main control unit 101 receives information on contact and a grip state of an object from the respective sensors 21. The main control unit 101 drives, on the basis of the information on the contact and the grip state of the object from the respective sensors 21, necessary one(s) of the actuators 102-1 to 102-n using softness of the sensors 21 themselves, grippability generated by friction on the surfaces of the sensors 21 to cause the robot hand 1 to grip the object and move and carry the object.

The actuators 102-1 to 102-n are disposed in the respective joint sections (i.e., the shoulder joint section 11, the elbow joint section 13, the wrist section 15, and the finger joint section of the hand section 16) of the robot hand 1. Therefore, the respective joint sections can rotate with a predetermined degree of freedom. The actuators 102-1 to 102-n drive the joint sections in accordance with a driving signal from the main control unit 101.

The sensor 21 includes a sensor circuit unit 111 and a signal processing unit 112. The sensor circuit unit 111 includes an x output stabilization circuit 121, a y output stabilization circuit 122, and a z output stabilization circuit 123. The sensor 21 stabilizes an output voltage from the Hall element group 91 and outputs final output voltages on the respective axes to the signal processing unit 112.

The x output stabilization circuit 121 differentially amplifies output voltages from the Hall elements 81x1 and 81x2 on the x axis to generate a stabilized final output voltage Vhx on the x axis and outputs the final output voltage Vhx on the x axis to the signal processing unit 112. The y output stabilization circuit 122 differentially amplifies output voltages from the Hall elements 81y1 and 81y2 on the y axis to generate a stabilized final output voltage Vhy on the y axis and outputs the final output voltage Vhy on the y axis to the signal processing unit 112. The z output stabilization circuit 123 amplifies an output voltage from the Hall element 81z on the z axis to generate a stabilized final output voltage Vhz on the z axis and outputs the final output voltage Vhz on the z axis to the signal processing unit 112.

The signal processing unit 112 calculates a center position of contact with a gripped object and a pressure value generated in the center position from the output voltage outputted from the sensor circuit unit 111 to convert a grip state such as a static state and a dynamic behavior of the object and detect the grip state. The signal processing unit 112 outputs the information on the detected grip state to the main control unit 101 via the external connection section 33 on a real time basis.

Figure 16:
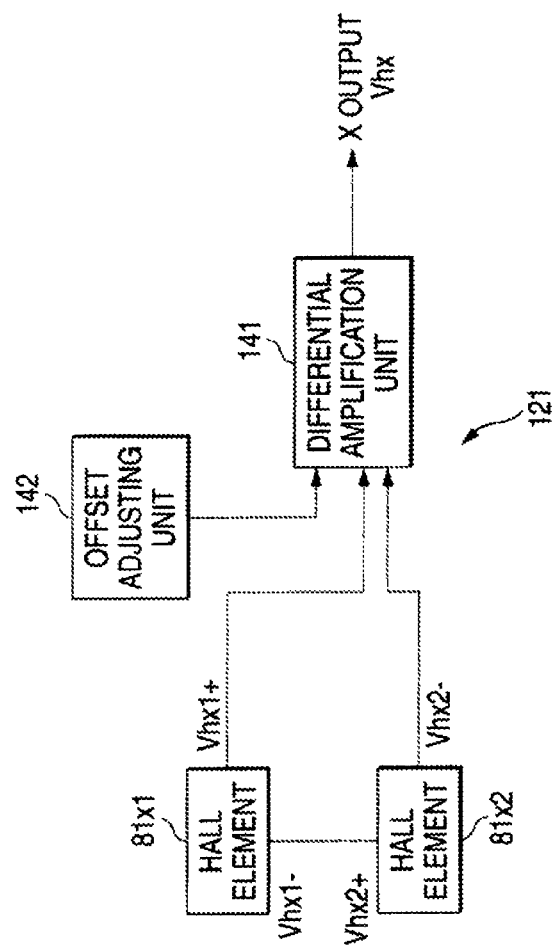
FIG. 16 is a block diagram showing an example of a structure of an x output stabilization circuit in FIG. 15.

FIG. 16 is a block diagram showing an example of a structure of the x output stabilization circuit 121. The y output stabilization circuit 122 has a structure basically the same as the structure of the x output stabilization circuit 121 shown in FIG. 16. Therefore, redundant explanation and illustration of the structure are omitted.

In the example in FIG. 16, the x output stabilization circuit 121 includes the Hall elements 81x1 and 81x2, a differential amplification unit 141, and an offset adjusting unit 142.

The Hall elements 81x1 and 81x2 catch the magnetic flux Bd(x) from the vertical direction and generate output voltages in directions perpendicular to a current direction and a magnetic field direction, respectively. A positive output voltage Vhx1+ and a negative output voltage Vhx1− are outputted from the Hall element 81x1. A positive output voltage vhx2+ and a negative output voltage Vhx2− are outputted from the Hall element 81x2. In the example in FIG. 16, a negative output of the Hall element 81x1 and a positive output of the Hall element 81x2 are connected in terms of a circuit. Consequently, the Hall elements 81x1 and 81x2 are formed as one Hall element. Only the positive output voltage Vhx1+ from the Hall element 81x1 and the negative output voltage Vhx2− from the Hall element 81x2 are outputted to the differential amplification unit 141.

The differential amplification unit 141 differentially amplifies the positive output voltage Vhx1+ and the negative output voltage Vhx2− from the Hall elements 81x1 and 81x2 on the basis of a midpoint voltage of a final output voltage Vhx (hereinafter referred to as X output as well) on the x axis set by the offset adjusting unit 142 to generate a stabilized final output voltage Vhx on the x axis and outputs the X output to the signal processing unit 112. The differential amplification unit 141 can be formed as a circuit or can be formed as a computing unit that performs subtraction.

The offset adjusting unit 142 adjusts (sets) a value (initial dispersion) of a midpoint voltage of the X output outputted from the differential amplification unit 141, for example, during initial shipment. When the sensor 21 includes plural Hall element groups 91, the offset adjusting unit 142 can perform adjustment for uniformalizing magnitudes of midpoint voltages of X outputs outputted from differential amplification units 141 of x output stabilization circuits 121 corresponding to the other Hall element groups 91. The offset adjusting unit 142 can also adjust a value of a midpoint voltage of the X output outputted from the differential amplification unit 141 that is out of order because of aged deterioration. The adjustment of the aged deterioration may be performed by an arithmetic operation in the signal processing unit 112 or the like.

In the example in FIG. 16, the negative output of the Hall element 81x1 and the positive output of the Hall element 81x2 are connected in terms of a circuit. However, it is also possible to output the positive output voltage Vhx1+ and the negative output voltage Vhx1− from the Hall element 81x1 and the positive output voltage Vhx2+ and the negative output voltage Vhx2− from the Hall element 81x2 without connecting the Hall element 81x1 and the Hall element 81x2 in terms of a circuit and cause the differential amplification unit 141 to differentially amplify the output voltages.

Figure 17:
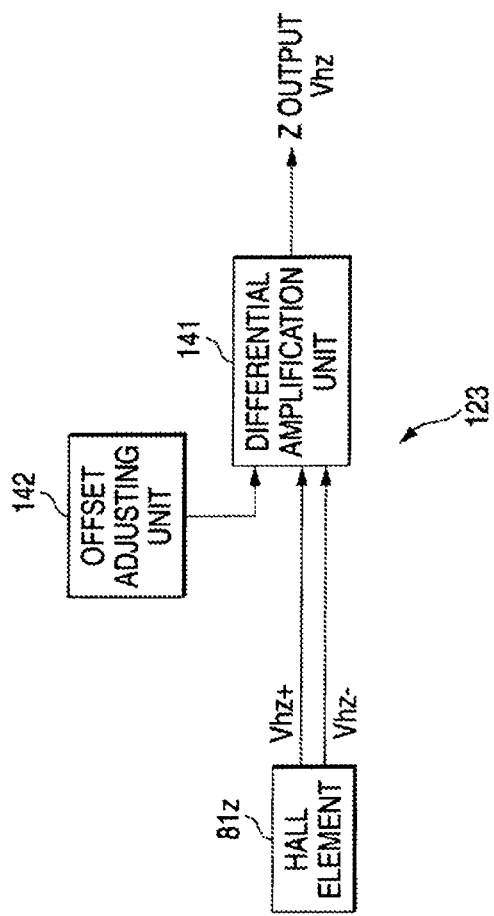
FIG. 17 is a block diagram showing an example of a structure of a z output stabilization circuit in FIG. 15.

FIG. 17 is a block diagram showing an example of a structure of the x output stabilization circuit 123. The z output stabilization circuit 123 in FIG. 17 is different from the x output stabilization circuit 121 in FIG. 16 only in that the two Hall elements 81x1 and 81x2 are replaced with one Hall element 81z. The z output stabilization circuit 123 is the same as the x output stabilization circuit 121 in that the z output stabilization circuit 123 includes the differential amplification unit 141 and the offset adjusting unit 142.

The Hall element 81z catches the magnetic flux Bd(z) from the vertical direction and generates a positive output voltage Vhz+ and a negative output voltage Vhz− in directions perpendicular to a current direction and a magnetic field direction. The positive output voltage Vhz+ and the negative output voltage Vhz− from the Hall element 81z are outputted to the differential amplification unit 141.

The differential amplification unit 141 and the offset adjusting unit 142 have structures same as those in the example in FIG. 16. In the example in FIG. 17, the differential amplification unit 141 differentially amplifies the positive output voltage Vhz+ and the negative output voltage Vhz− from the Hall element 81z on the basis of a midpoint voltage of the final output voltage Vhz (hereinafter also referred to as Z output) on the z axis set by the offset adjusting unit 142 to generate the stabilized final output voltage Vhz on the z axis and outputs the Z output to the signal processing unit 112.

The offset adjusting unit 142 adjusts (sets) a value of a midpoint voltage of the Z output outputted from the differential amplification unit 141, for example, during initial shipment. When the sensor 21 includes plural Hall element groups 91, the offset adjusting unit 142 performs adjustment for uniformalizing magnitudes of midpoint voltages of Z outputs outputted from differential amplification units 141 of z output stabilization circuits 123 corresponding to the other Hall element groups 91. The offset adjusting unit 142 also adjusts a value of a midpoint voltage of the Z output outputted from the differential amplification unit 141 that is out of order because of aged deterioration.

Figure 18:
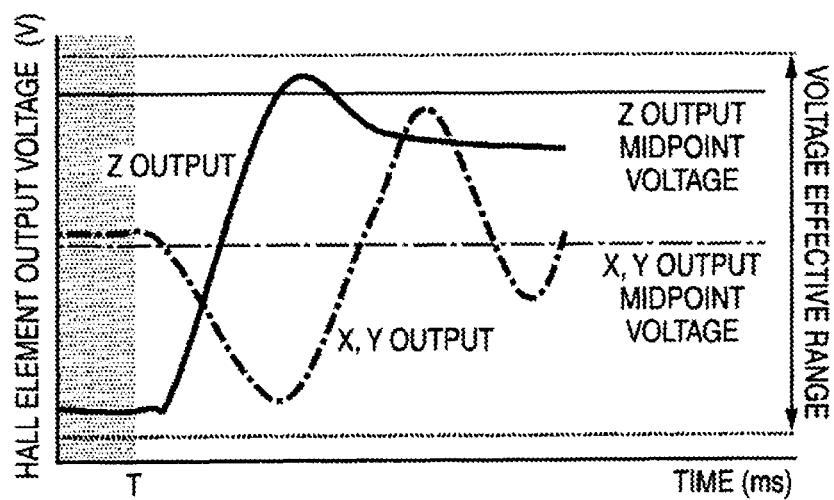
FIG. 18 is a graph for explaining a midpoint voltage of a final output voltage.

A midpoint voltage of a final output voltage set by the offset adjusting unit 142 will be explained with reference to FIG. 18. In an example in FIG. 18, output voltages [V] from respective Hall elements, midpoint voltages in the case of no load, and a voltage effective range (between dotted lines in the figure) are shown according to the elapse of time [ms]. Until time T, output voltages of only bias magnetic fields without load input are shown. After time T, output voltages at the time when bias magnetic fields due to load input change are shown.

As indicated by a thick alternate long and short dash line, an X, Y output voltage takes a value in the substantial center of the voltage effective range before loading. When the load is applied after time T, the bias magnetic fields change and a direction of a magnetic flux density vector may be reversed by a great degree. Therefore, as indicated by an alternate long and short dash line, a midpoint voltage of the X, Y output is set in the substantial center of the effective range.

On this other hand, as indicated by a thick solid line, a Z output voltage takes a value on one side (in the case of the example in FIG. 18, a lower side) of the voltage effective range before loading. Even if the load is applied after time T, a magnetic flux density vector is not reversed by a great degree because of a load direction, a sensor shape, a material characteristic, and the like. Therefore, for the purpose of using the voltage effective range wide, the midpoint voltage of the Z output is set to be close to one side (in the case of the example in FIG. 18, an upper side) of the voltage effective range. However, slight deformation of an expanding material (the stress-field converting section 41) occurs near a loading object during loading. Therefore, it is necessary to set the midpoint voltage of the Z output taking into account a certain degree of allowance without setting the midpoint voltage to be just fit in the voltage effective range.

Figure 19:
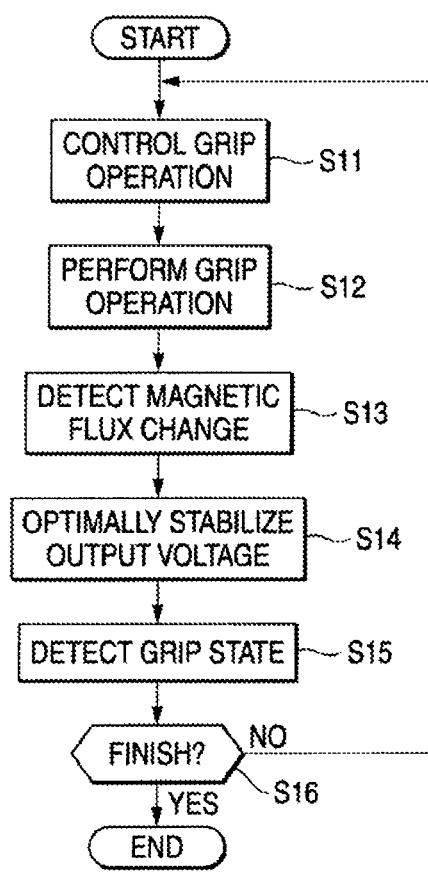
FIG. 19 is a flowchart for explaining operations of the robot hand manipulator in FIG. 1.

Operations of the robot hand manipulator and input information detection processing involved in the operations will be explained with reference to a flowchart in FIG. 19. In an example in FIG. 19, grip of an object by the robot hand manipulator in FIG. 1 will be explained as an example.

In step S11, the main control unit 101 drives, on the basis of information on contact and a grip state of an object from the respective sensors 21 detected in the control program stored in the memory, or in step S15 described later, necessary one(s) of the actuators 102-1 to 102-n provided in the respective joint sections and the like of the robot hand 1 using softness of the sensors 21 themselves, grippability generated by friction on the surfaces of the sensors 21 to control an operation for gripping a predetermined object (e.g., a mug) by the robot hand 1.

In step S12, the actuator 102 corresponding to the robot hand 1 performs a grip operation under the control for the grip operation by the main control unit 101. Consequently, pulling load, contact, slide, and vibration phenomena and the like occur between the object to be gripped and the sensors 21 provided in the respective sections of the robot hand 1. The stress-field converting section 41 including the viscoelastic magnet starts to be deformed by a shape and a stress of the object. Therefore, the bias magnetic fields B applied to the stress-field converting section 41 change. A magnetic flux density Bd in the viscoelastic magnet generated by the bias magnetic fields B is represented by the following Equation (1).

$$Bd = J - \mu_0 Hd \quad (1)$$

Bd represents a magnetic flux density [T] or [Wb/m^2] (m^2: the square of m) in the magnet, J represents magnetic polarization [T], μ0 represents a magnetic permeability [μH/m] or [Wb/m^2] of the vacuum, and Hd represents strength [A/m] of a magnetic field in the magnet.

As described above with reference to FIG. 7, a magnetic flux generated on the outside of the magnet also changes according to a change in a demagnetizing field in the magnet. In response to this change, in step S13, the Hall element group 91 including the Hall elements 81 on the three axes detects a change in a magnetic flux generated from the surface of the stress-field converting section 41 adjacent to thereto, performs magnetoelectric conversion, and outputs a voltage to the differential amplification unit 141 corresponding thereto. The magnetoelectric conversion in the Hall element group 91 is represented by the following Equation (2).

$$Vh(x,y,z) = RhIcBd(x,y,z) \times (1/d) \quad (2)$$

Vh(x,y,z) represents Hall voltages [V] on the respective axes, Rh represents a resistance [Ω] of a Hall element, Ic represents a current value [A], Bd(x,y,z) represents magnetic flux densities on the respective axes [T], and d represents the thickness [mm] of the Hall element.

In step S14, the differential amplification unit 141 optimally stabilizes output voltages from the Hall elements 81 on the basis of midpoint voltages of the respective outputs set in advance. The differential amplification unit 141 differentially amplifies the output voltages from the Hall elements 81 by performing gain adjustment on the basis of a midpoint voltage under the bias magnetic fields B, generates stabilized final output voltages, and outputs the final output voltages to the signal processing unit 112.

In step S15, the signal processing unit 112 detects a grip state of the object from the final output voltages on the three axes x, y, and z. For example, the signal processing unit 112 calculates a center position of contact with the object to be gripped, a pressure value generated in the contact center position, and the like from the final output voltages on the three axes x, y, and z to detect a grip state. Information on the detected grip state is outputted to the main control unit 101 on a real time basis.

In step S16, the main control unit 101 judges whether the processing should be finished. When it is judged that the processing is not finished, the main control unit 101 returns to step 511. The processing in step S11 and the subsequent steps is repeated. The main control unit 101 controls operations of the robot hand 1 on the basis of the information on the grip state detected in step S15. On the other hand, when it is judged in step S16 that the processing is finished, the object grip processing in FIG. 19 is finished.

As described above, the input section 31 that inputs information from the object includes the stress-field converting section 41 made of the viscoelastic magnet. Changes in the bias magnetic fields B corresponding to the deformation of the stress-field converting section 41 due to pulling load, contact, slide, and vibration phenomena and the like, which occur between the sensors and the object to be gripped, are detected by the Hall elements 81 as changes in voltages from changes in a magnitude of a density and a direction of a magnetic flux. Therefore, information on a position of contact with the object to be gripped and the like are accurately acquired.

Since states of the pulling load, contact, slide, and vibration phenomena and the like, which occur between the sensors and the object to be gripped, are detected, the robot hand manipulator in FIG. 1 can control the fall of the object and the like and accurately grip and manipulate an arbitrary object.

Information that can be acquired using the changes in the bias magnetic fields B corresponding to the deformation of the stress-field converting section 41, i.e., the changes in the voltages outputted from the Hall elements, will be explained.

First, a load pressure and a depth calculated (estimated) during detection of a grip state in step S15 in FIG. 19 will be explained using the changes in the voltages outputted from the Hall elements 81 with reference to FIGS. 20 and 21.

Figure 20:
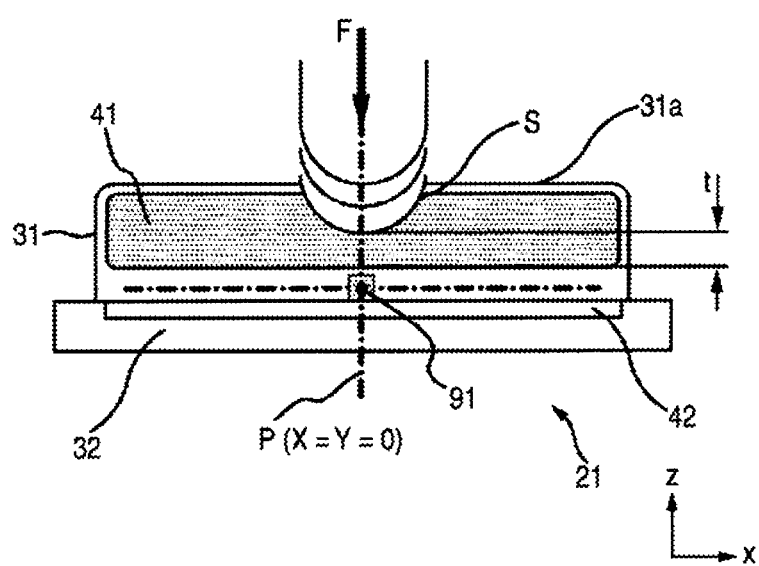
FIG. 20 is a diagram for explaining a loading pressure and a depth calculated using a change in a voltage.

FIG. 20 is a side sectional view of the sensor 21. In an example in FIG. 20, the circuit board 61 (the magnetic-field detecting section 42), which is arranged such that one Hall element group 91 is in the center position of the input plane 31a, is fixed to the fixing section 32 below the stress-field converting section 41. An x axis (a horizontal direction in the figure) and a z axis (a vertical direction in the figure) among x, y, and z axes of an XYZ coordinate system with the Hall element group 91 set as an origin are shown.

An object having an arbitrary shape applies the load F in a contact area S with an arbitrary position on the sensor 21 (in the case of the example in FIG. 20, a position right above the Hall element group 91 (x=y=0)) set as a loading center P. In this case, a relation among the final output voltage Vhz from the Hall element 81z on the z axis, the pressure value during loading F, and the thickness t of the material (the stress-field converting section 41) on the Hall element group 91 is represented as shown in FIG. 21.

Figure 21:
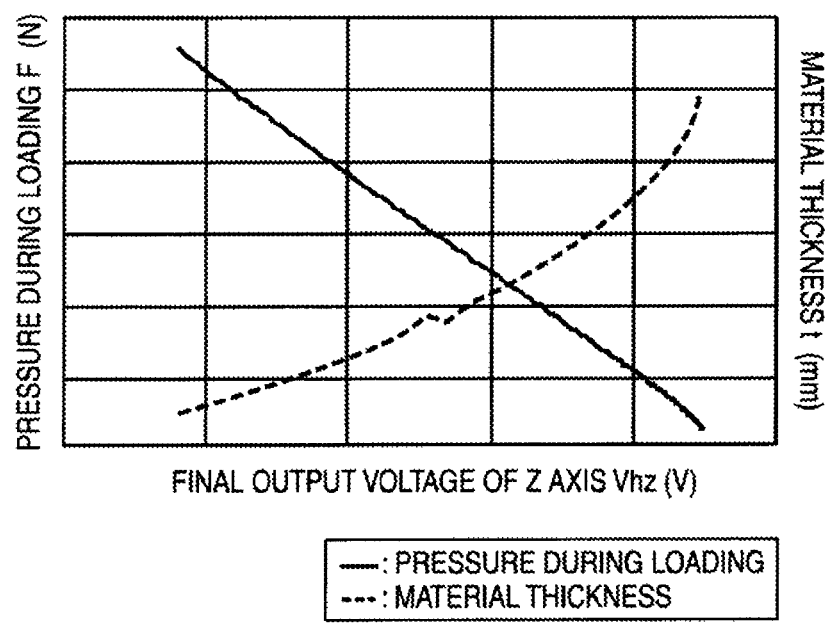
FIG. 21 is a graph for explaining the loading pressure and the depth calculated using the change in the voltage.

FIG. 21 is a graph showing a relation among the final output voltage Vhz from the Hall element 81z on the z axis, the load (the pressure value) F, and the material thickness t in the case of the example in FIG. 20. In the example in FIG. 21, the abscissa represents the final output voltage Vhz [V] from the Hall element 81z on the z axis, a solid line represents the pressure value during loading F [N], and a dotted line represents the material thickness t [mm].

As indicated by the solid line, when the pressure value during loading F increases, the final output voltage Vhz decreases. As indicated by the dotted line, when the material thickness t increases, the final output voltage Vhz also increases.

As described above, if the final output voltage Vhz from the Hall element 81z on the z axis is determined, the pressure value during loading F and the material thickness t are uniquely determined. Therefore, it is possible to estimate a pressure during loading and a depth T (original material thickness t—material thickness during loading t) according to the final output voltage from the Hall element 81z on the z axis. Consequently, it is possible to accurately detect a grip state.

In the above explanation, the loading center P is right above the Hall element group 91 (x=y=0). However, even when the loading center P is in other positions, if the final output voltage Vhz from the Hall element 81z on the z axis is determined, the pressure value during loading F and the material thickness t are uniquely determined.

In this case, these two values (the pressure value during loading F and the material thickness t) are estimated by different formulas depending on a distance to the loading center P with a position of the Hall element group 91, which detects a magnetic flux, set as the center on the xy plane. When the loading center P is in a position on a concentric circle with the position of the Hall element group 91 set as the center, substantially the same calculation result should be obtained.

It is possible to change the formulas according to a distance from the position of the Hall element group 91 to the loading center P by combining the calculation with loading position estimation described later with reference to FIGS. 22 and 23 or by performing load calibration at multiple points by the Hall element group 91. In other words, the load calibration at multiple points means that formulas that should be used when the load is applied to respective points (e.g., (x=1, Y=0)) are stored in a calibration table or the like in advance for plural points on the input plane 31a.

A loading position calculated (estimated) during detection of a grip state in step S15 in FIG. 19 using changes in voltages outputted from the Hall elements 81 will be explained with reference to FIGS. 22 and 23.

Figure 22:
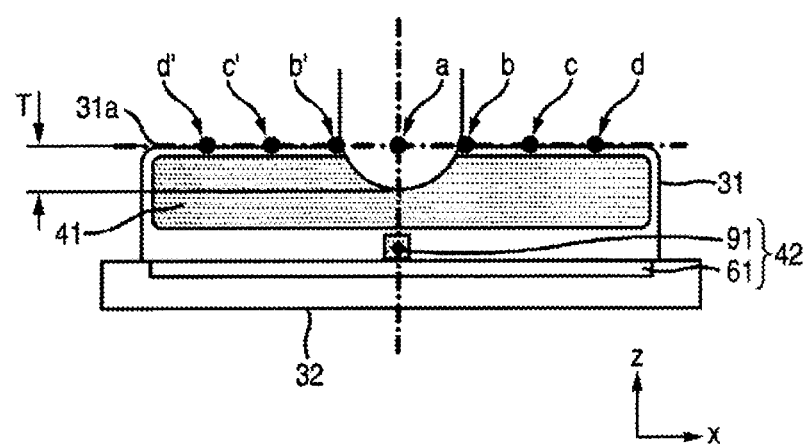
FIG. 22 is a diagram for explaining loading positions calculated using a change in a voltage.

FIG. 22 is a side sectional view of the sensor 21. In an example in FIG. 22, an x axis (a horizontal direction in the figure) and a z axis (a vertical direction in the figure) among x, y, and z axes of an XYZ coordinate system with the center position of the input plane (the xy plane) 31a set as an origin are shown. The magnetic-field detecting section 42, which is constituted such that the Hall element group 91 is arranged right below the origin on the circuit board 61, is fixed to the fixing section 32 below the stress-field converting section 41.

On the input plane 31a (the x axis), from the left in the figure, loading positions "d'", "c'", "b'", "a", "b", "c", and "d" are shown as positions to be set as the loading center P of an object having an arbitrary shape on the x axis of the input plane 31a. In the case of the example in FIG. 22, the stress-field converting section 41 is depressed by the depth T in the loading position "a" by the load of the object having the arbitrary shape with the loading position "a" set as the loading center P.

The loading position "a" is located in a substantial center position on the x axis (i.e., right above the Hall element group 91). The loading positions "b'" and "b" are located in symmetrical positions on the x axis a distance D apart from the loading position "a", respectively. The loading positions "c'" and "c" are located in symmetrical positions on the x axis a distance twice as large as the distance D apart from the loading position "a", respectively. The loading positions "d'" and "d" are located in symmetrical positions on the x axis a distance three times as large as the distance D apart from the loading position "a", respectively.

For example, the position to be set as the loading center P is moved from the loading position "d'" to the loading position "d" while the load for depressing the input section 31 by an arbitrary depth T is applied thereto. According to the movement, the relation between the final output voltage Vhx on the x axis and the final output voltage Vhz on the z axis changes as shown in FIG. 23.

Figure 23:
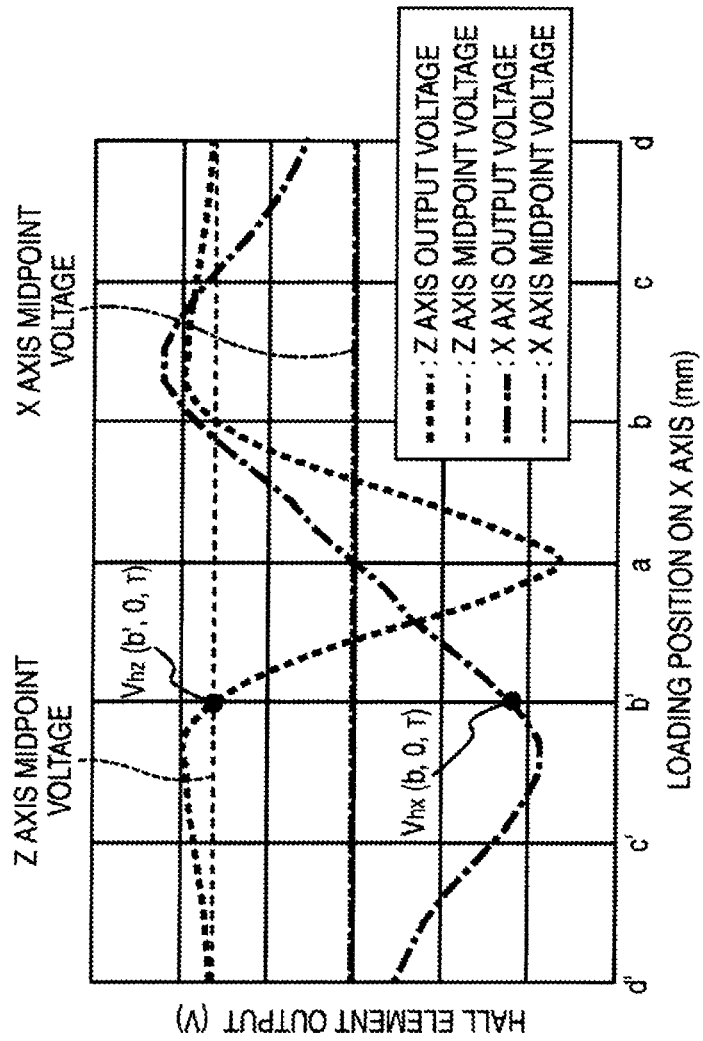
FIG. 23 is a graph for explaining the loading positions calculated using the change in the voltage.

In an example in FIG. 23, the abscissa represents the loading positions "d'", "c'", "b'", "a", "b", "c", and "d" [mm] on the x axis. A thick broken line represents the final output voltage Vhz [V] on the z axis at the time when the position to be set as the loading center P is moved to the respective loading positions. A broken line represents a midpoint voltage [V] on the z axis. A thick alternate long and short dash line represents the final output voltage Vhx [V] on the x axis. An alternate long and short dash line represents a midpoint voltage [V] on the x axis.

The Hall element 81z on the z axis forming the Hall element group 91 detects the magnetic flux Bd(z) from a direction perpendicular to the input plane 31a (a direction parallel to the z axis) and outputs the final output voltage Vhz on the z axis. Therefore, the final output voltage Vhz on the z axis gradually increases from a value same as the midpoint voltage because of the influence of the bulging phenomenon while the position to be set as the loading center P moves from the loading position "d'" most distant from the Hall element group 91 to a position just before the loading position "b'". The final output voltage Vhz on the z axis gradually decreases through a value same as the midpoint voltage in the load position b' while the position to be set as the loading center P moves from the position just before the loading position "b'" to the loading position "a". When the load is applied to the input section 31 to depress the input section 31 by the arbitrary depth T with the loading position "a" located right below the Hall element group 91 set as the loading center P, the final output voltage Vhz on the z axis takes a minimum value.

The final output voltage Vhz on the z axis gradually increases through a value same as the midpoint voltage in the loading position "b'" while the position to be set as the loading center P moves from the loading position "a" to a position just behind the loading position "b". The final output voltage Vhz on the z axis gradually decreases to be closer to the midpoint voltage from the value slightly larger than the midpoint voltage because of the influence of the bulging phenomenon after the position just behind the loading position "b" (including the loading position "d" most distant from the Hall element group 91).

It is seen that, when the position to be set as the loading center P is moved from the loading position "d'" to the loading position "d" as described above, the final output voltage Vhz on the z axis takes values symmetrical (line symmetrical) to the position (the loading position "a") right above the Hall element group 91 (a position on the input plane 31a).

On the other hand, the Hall element 81x on the x axis forming the Hall element group 91 detects the magnetic flux Bd(x) from a direction perpendicular to the z axis (a direction parallel to the input plane 31a) and outputs the final output voltage Vhx on the x axis. Therefore, the final output voltage Vhx on the x axis gradually decreases while the position to be set as the loading center P moves from the loading position "d'" most distant from the Hall element group 91 to a substantial center position between the loading position "c'" and the loading position "b'". When the load is applied to the input section 31 to depress the input section by the arbitrary depth T with the substantial center position between the loading position "c'" and the loading position "b'" set as the loading center P, the final output voltage Vhx on the x axis takes a minimum value.

The final output voltage Vhx on the x axis gradually increases through a value same as the midpoint voltage in the loading position "a" while the position to be set as the loading center P moves from the substantial center position between the loading position "c'" and the loading position "b'" to a substantial center position between the loading position "b" and the loading position "c". When the load is applied to the input section 31 to depress the input section by the arbitrary depth T with the substantial center position between the loading position "b" and the loading position "c" set as the loading center P, the final output voltage Vhx on the x axis takes a maximum value.

The final output voltage Vhx on the x axis gradually decreases until the position to be set as the loading center P moves from the substantial center position between the loading position "b" and the loading position "c" to the loading position "d".

It is seen that, when the position to be set as the loading center P is moved from the loading position "d'" to the loading position "d" as described above, the final output voltage Vhx on the x axis takes values symmetrical (line symmetrical) to the position (the loading position "a") right above the Hall element group 91 (a position on the input plane 31a).

As a result, the loading position "b'" (b', 0, T) on the x axis is uniquely determined by the final output voltage Vhx (b', 0, T) on the x axis and the final output voltage Vhz (b', 0, T) on the z axis. This holds true for the y axis. Although not shown in the figure, a graph of the final output voltage Vhy on the y axis is a graph substantially symmetrical to the graph of the final output voltage Vhx on the x axis with respect to the midpoint voltage on the x axis in FIG. 23. Therefore, it is possible to estimate loading positions on the entire input plane (the xy plane) $31a$ of the sensor 21 by using a combination of the final output voltage Vhx on the x axis and the final output voltage Vhy on the y axis, the final output voltage Vhz on the z axis, and the load calibration at multiple points by the Hall element group 91 described above.

Figure 24:
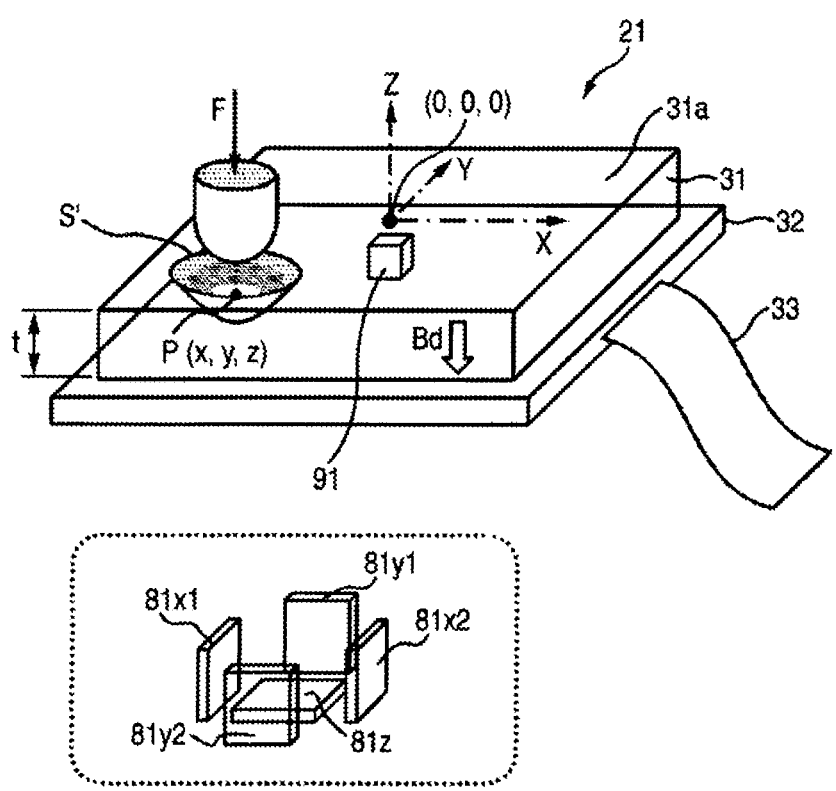
FIG. 24 is a diagram for explaining a flow of estimation of a loading position from a load on the sensor.
Figure 25:
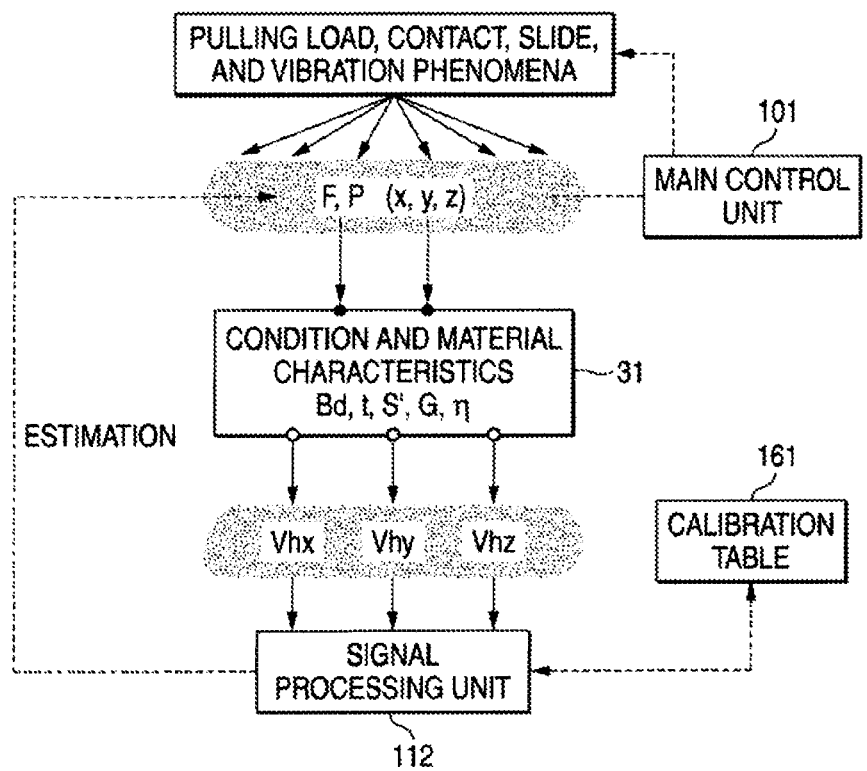
FIG. 25 is a diagram for explaining the flow of the estimation of a loading position from the load on the sensor.

FIGS. 24 and 25 are diagrams for explaining a flow of estimation of loading positions from the load on the sensor 21. In an example in FIG. 25, a flow of estimation of loading positions from the load on the sensor 21 shown in FIG. 24 is shown.

In an example in FIG. 24, the sensor 21 including the input section 31, the fixing section 32, and the external connection section 33 is shown in an XYZ coordinate system with the substantial center position of the input plane (the xy plane) $31a$ of the input section 31 set as an origin (0, 0, 0).

The input section 31 is formed of the viscoelastic magnet (the stress-field converting section 41) having the thickness t and the magnetic flux density Bd generated by a bias magnetic field. In the input section 31, the Hall element group 91 including the Hall elements $81x1$ and $81x2$ on the x axis, the Hall elements $81y1$ and $81y2$ on the y axis, and the Hall element $81z$ on the z axis forming the magnetic-field detecting section 42 is arranged in a position right below the origin.

As shown in FIG. 25, the input section 31 has conditions and material characteristics such as the magnetic flux density Bd generated by a bias magnetic field, the thickness t of the viscoelastic magnet, a contact area S' of contact with an arbitrary object, a spring constant (an elastic coefficient) G, and a viscosity coefficient η.

The load F in the contact area S' in contact with the arbitrary object is applied to the input section 31 with the loading-center P set as (x, y, z) by pulling load, contact, slide, and vibration phenomena and the like due to the arbitrary object shown in FIG. 25. Consequently, the input section 31 including the viscoelastic magnet is deformed and the magnetic flux density generated by a bias magnetic field changes. In this case, the Hall elements 81 on the respective axes forming the Hall element group 91 output voltages according to the magnetic flux density. The final output voltages Vhx, Vhy, and Vhz obtained by stabilizing the voltages, respectively, are outputted to the signal processing unit 112.

The signal processing unit 112 stores in advance a calibration table 161 for the load calibration in multiple points described above with reference to FIG. 21. The signal processing unit 112 can estimate a contact center position (i.e., a lading center) P(x, y, z) of contact with an object to be gripped, a pressure value (i.e., a load) F generated in the contact center position, and the like using the final output voltages on the three axes x, y, and z and, when necessary, with reference to the calibration table 161. The signal processing unit 112 can obtain a static state, a dynamic behavior, and the like of the object as a grip state of the object with reference to the conditions and material characteristics such as the magnetic flux density Bd generated by a bias magnetic field, the thickness t of the viscoelastic magnet, the contact area S' of contact with the arbitrary object, the spring constant (the elastic coefficient) G, and the viscosity coefficient η of the input section 31.

The signal processing unit 112 outputs the contact center position P (x, y, z), the pressure value F, and the like to the main control unit 101 as information on the grip state of the object. Thus, the main control unit 101 can learn the grip state of the object (i.e., pulling load, contact, slide, and vibration phenomena and the like applied to the input section 31 by the arbitrary object). Therefore, the main control unit 101 can control the pulling load, contact, slide, and vibration phenomena and the like applied to the input section 31 by the arbitrary object. The next loading center P(x, y, z) and load F on the input section 31 are adjusted according to this control.

Figure 26:
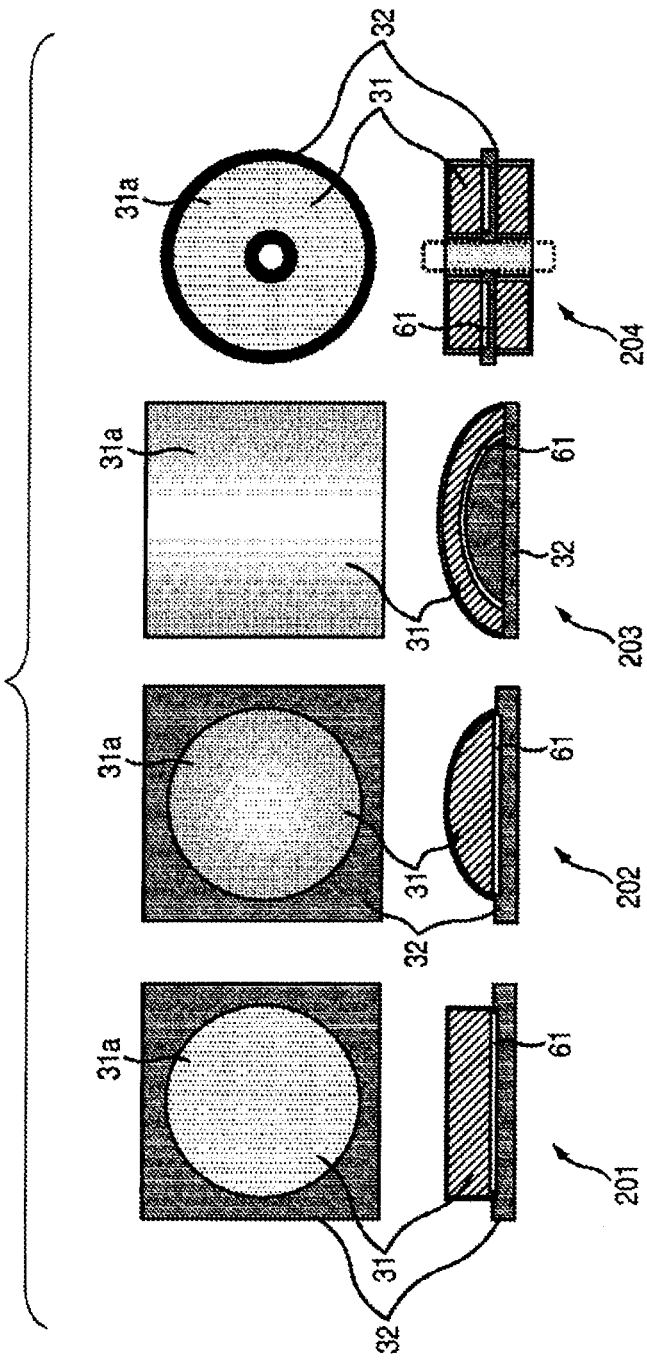
FIG. 26 is a diagram showing an example of another external structure of the sensor in FIG. 2.

FIG. 26 is a diagram showing an example of another external structure of the sensor in FIG. 2. In the example in FIG. 26, in the upper part in the figure, plan views of sensors 201 to 204 having different shapes of the input section 31 viewed from right above are shown. In the lower part in the figure, sectional views of the sensors 201 to 209 viewed from sides are shown. In each of the sectional views, the circuit board 61 of the magnetic-field detecting section 92 is shown between the input section 31 and the fixing section 32.

The sensor 201 includes the input plane $31a$ that is circular viewed from right above and the columnar input section 31 that is square viewed from the side. The sensor 202 includes the input plane $31a$ that is circular viewed from right above and the dome-shaped input section 31 that is dome-shaped when viewed from the side. The sensor 203 includes the input plane $31a$ that is square when viewed from right above and the semicylindrical input section 31 that is semicylindrical when viewed from the side. For example, a flexible substrate or the like is used as the circuit board 61 in the sensor 203.

The sensor 204 includes the input plane $31a$ that is doughnut-shaped viewed from right above and the columnar input section 31 that is square and formed to sandwich the fixing section 32. A shaft can be provided as indicated by a dotted line in a hole (hollow) portion of the doughnut in the sensor 204.

As in the sensors 201 and 202, by forming the input section 31 such that the input plane $31a$ is formed in a circular shape, it is possible to prevent unevenness of magnetic fluxes and the like that occur at corners and edges of a plane of the square pole sensor 21 in FIG. 2.

As in the sensors 202 and 203, by forming the input section 31 in a dome shape and a semicylindrical shape viewed from the side, it is possible to prevent the fall in the magnetic field in the substantial center part in the input plane $31a$ that occurs in the square pole sensor 2 in FIG. 2. The dome shape and the semicylindrical shape of the sensors 202 and 203 can prevent an error in detection that tends to occur when a plane object is brought into contact with a plane sensor. Therefore, the sensors 202 and 203 are suitably provided in a device that comes into contact with an object, for example, the robot hand 1.

Moreover, by forming the input section 31 in the doughnut shape as in the sensor 204, it is possible to insert a shaft through the doughnut portion and detect magnetic flux densities from above and below the input section 31. This sensor is suitably provided in, for example, respective joint sections and the like of the robot hand 1.

Figure 27:
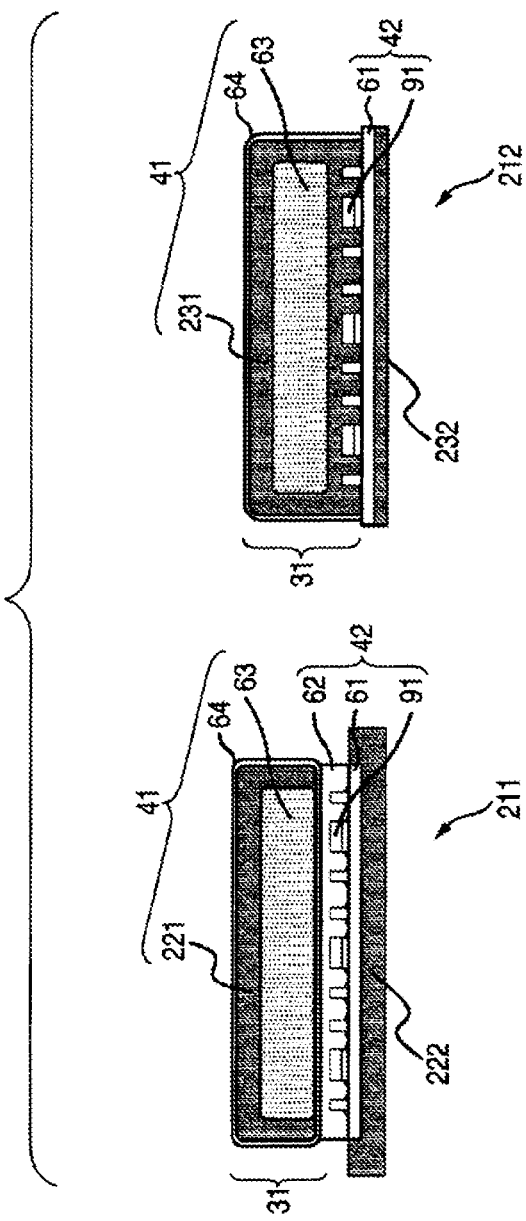
FIG. 27 is a diagram showing another example of the material of the input section in FIG. 6.

FIG. 27 is a diagram showing another example of the material of the input section in FIG. 6. In the example in FIG. 27, side sectional views of the sensors 211 and 212, which are added with shields for preventing leakage and entrance of magnetism, viewed from the sides are shown.

The sensor 211 is different from the sensor 21 in FIG. 6 in that the fixing section 32 is replaced with a fixing section 222 having a shield function and the stress-field converting section 41 includes a viscoelastic material 221 having the shield function in addition to the viscoelastic magnet 63 and the silicon rubber 64. The sensor 211 is the same as the sensor 21 in FIG. 6 in that the Hall element group 91 is arranged and the magnetic-field detecting section 42 includes the circuit board 61 molded with the resin 62.

The stress-field converting section 41 of the sensor 211 is formed with the viscoelastic material 221 having the shield function integrated with other surfaces excluding the bottom surface (i.e., the upper surface and the side) of the viscoelastic magnet 63 and formed with the thin-film silicon rubber 64 integrated with the surface of the viscoelastic material 221.

In other words, in the sensor 211, the magnetic-field detecting section 42 is shielded from above and below by the viscoelastic material 221 on the viscoelastic magnet 63 and the fixing section 222 under the circuit board 61. Consequently, it is possible to prevent the fall in the performance of the sensor 211.

The sensor 212 is different from the sensor 21 in that the fixing section 32 is replaced with a fixing section 232 having the shield function and the circuit board 61, on which the Hall element group 91 of the magnetic-field detecting section 42 is arranged, is formed by being integrated with the viscoelastic material 231 having the shield function by molding together with the viscoelastic magnet 63 of the stress-field converting section 41 and formed with the thin-film silicon rubber 64 integrated with the surface of the viscoelastic material 231.

In other words, the sensor 212 is different from the sensor 211 in that the resin 62 of the sensor 211 is replaced with the viscoelastic material 231 having the shield function. Consequently, it is possible to prevent leakage and entrance of magnetism between the viscoelastic magnet 63 and the circuit board 61 and further prevent the fall in the performance of the sensor 212.

Figure 28:
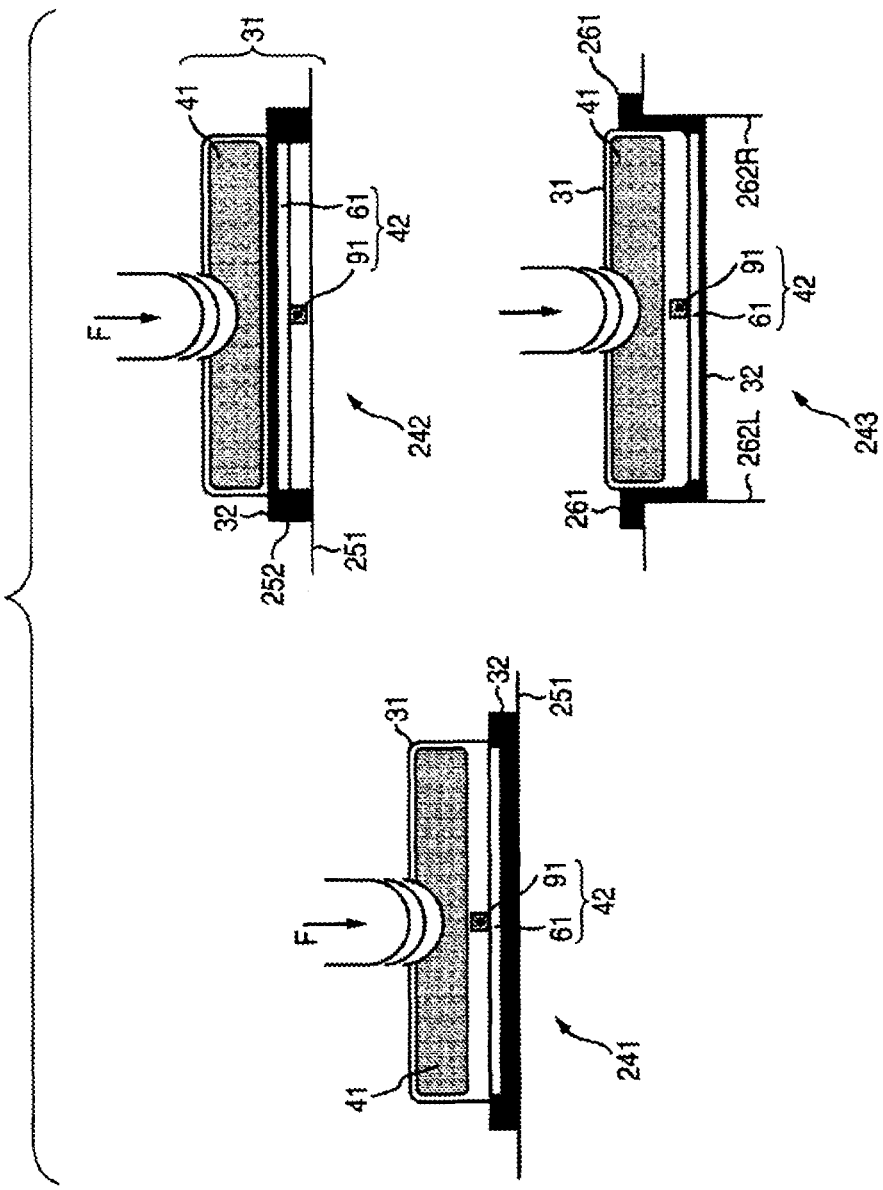
FIG. 28 is a diagram showing an example of a fixing section of the sensor.

FIG. 28 is a diagram showing an example of a fixing section of a sensor. In the example in FIG. 28, side sectional views of sensors 241 to 243 having different shapes of the fixing section 32 viewed from the sides are shown.

The sensor 241 has a structure same as that of the sensor 21 in FIG. 3. In the sensor 241, the fixing section 32 is provided at the bottom on a setting surface 251. The magnetic-field detecting section 42 including the circuit board 61, on which the Hall element group 91 is arranged, and the input section 31 composed of the stress-field converting section 41 arranged on the magnetic-field detecting section 42 is fixed on the fixing section 32.

Therefore, when the load F in an arrow direction is applied to the input section 31, the fixing section 32 supports the input section 31 made of a deformable material under the circuit board 61. In this case, the surface of the circuit board 61, on which the Hall element group 91 is arranged, can be molded with the resin 62 or the like or does not have to be molded.

In the sensor 242, the fixing section 32 to which the magnetic-field detecting section 42 including the circuit board 61, on which the Hall element group 91 is arranged, is fixed is arranged on a setting surface 251 with the Hall element group 91 faced down. The stress-field converting section 41 is fixed on the fixing section 32. In the fixing section 32, only a peripheral portion 252 is formed high to prevent the circuit board 61 from colliding with the setting surface 251.

In the sensor 242, the fixing unit 32 is provided between the stress-field converting section 41 of the input section 31 and the magnetic-field detecting section 42. In this case, when the load F in an arrow direction is applied to the input section 31, since the fixing section 32 supports the deformation of the stress-field converting section 41, a physical influence of the deformation of the stress-field converting section 41 is hardly applied to the Hall element group 91.

The sensor 243 is different from the sensor 241 in that a projection 261 is formed around the fixing section 32. The sensor 243 includes the fixing section 32 having a shape without the setting surface 251. Since the setting surface 251 is not provided under the sensor 243, the projection 261 formed around the fixing section 32 is hooked on setting sections 262L and 262R provided near the sensor 243 to support the deformation of the stress-field converting section 41 due to the load F in the arrow direction.

Figure 29:
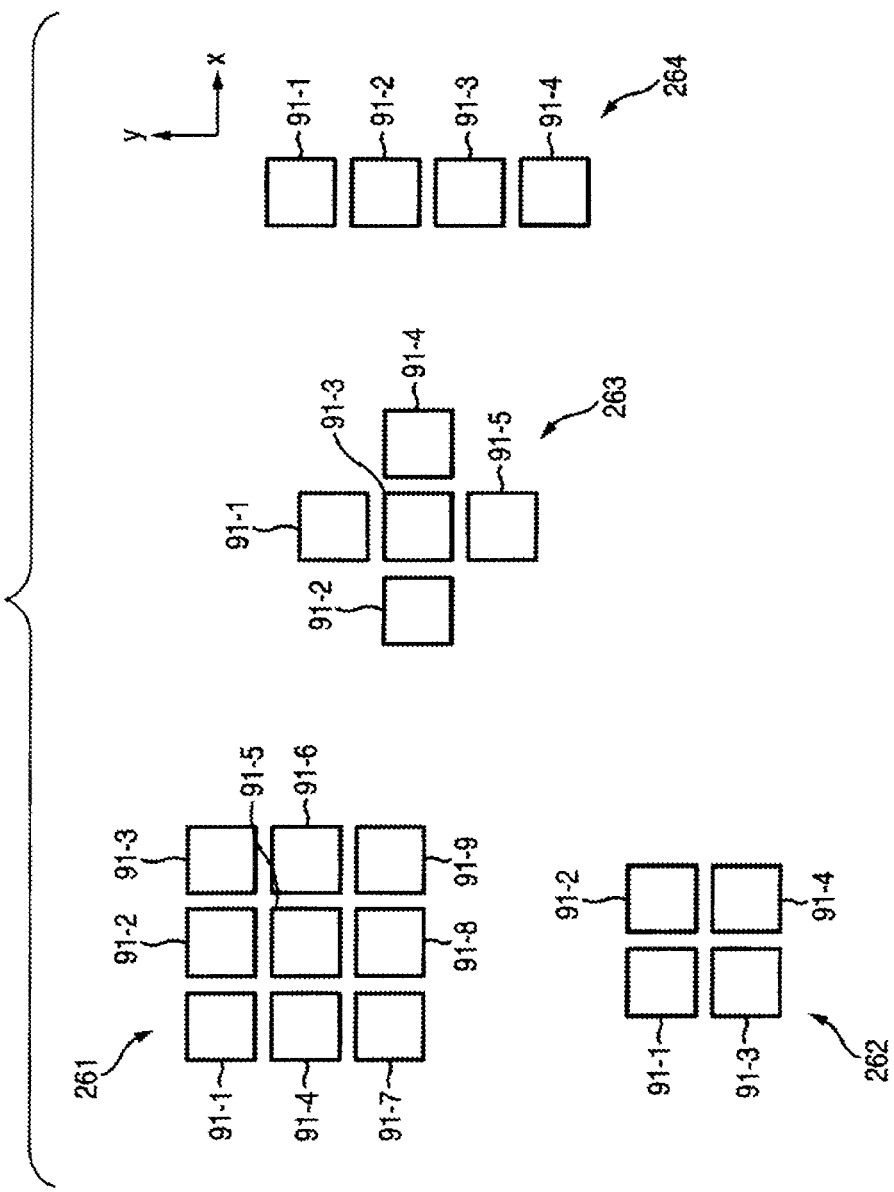
FIG. 29 is a diagram showing an example of an arrangement of plural Hall element groups.

FIG. 29 is a diagram showing an example of Hall element groups 91 arranged on the circuit board 61 forming the magnetic-field detecting section 42.

In the case of the example in FIG. 20, only one Hall element group 91 is shown on the circuit board 61. However, as shown in FIG. 29, plural Hall element groups 91 can be arranged on the circuit board 61. In the following explanation, the plural Hall element groups 91 are also referred to as a sensor matrix.

In the example in FIG. 29, an example of an arrangement of sensor matrixes 261 to 264 including the plural Hall element groups 91 on the circuit board 61 viewed from above is shown.

Figure 30:
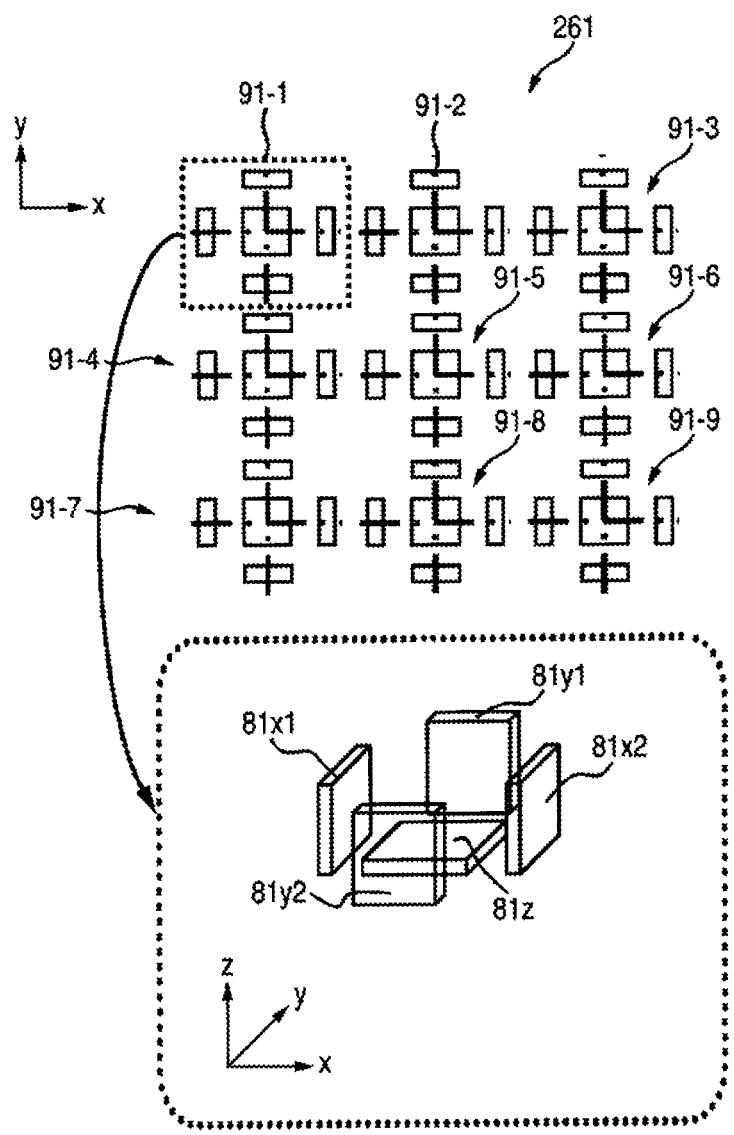
FIG. 30 is a diagram showing an example of a structure of the Hall element groups in FIG. 29.

In the sensor matrix 261, nine Hall element groups 91-1 to 91-9 are arranged in order in three rows vertically (in a y axis direction) and in three stages horizontally (in an x axis direction). As shown in FIG. 30 and as in the case of FIG. 14, the Hall element groups 91-1 and 91-9 include the Hall elements $81x1$ and $81x2$ on the x axis, the Hall elements $81y1$ and $81y2$ on the y axis, and the Hall element $81z1$ on the z axis.

In the sensor matrix 262, four Hall element groups 91-1 to 91-4 are arranged in order in two rows vertically (in the y axis direction) and in two stages horizontally (in the x axis direction). In the sensor matrix 263, five Hall element groups 91-1 to 91-5 are arranged in a crossing shape (a cross shape). In a first stage from the top in the figure, the Hall element group 91-1 is arranged, in a second stage, the three Hall element groups 91-2 to 91-4 are arranged to align the Hall element group 91-1 and the Hall element group 91-3 in one row, in a third stage, the Hall element group 91-5 is arranged to be aligned with the Hall element groups 91-1 and 91-3 in a row.

In the sensor matrix 264, four Hall element groups 91-1 to 91-4 are arranged linearly in one row vertically.

As described above, the magnetic-field detecting section 42 can be formed by arranging the plural Hall element groups 91 on the circuit board 61 according to a size and a shape of the input plane $31a$ of the input section 31. Consequently, it is possible to prevent detection accuracy from falling on any kind of the input plane $31a$.

In the above explanation, a pressure, a depression depth, and a position on an input plane can be estimated by the Hall element group 91 including the Hall elements 81 on the three axes. Besides, the Hall element group 91 can include the Hall elements 81 on two axes (the z axis is desirably included) among the x axis, the y axis, and the z axis. In this case, effects same as those in the case of the three axes are realized. It is possible to estimate a center position of contact with an object to be gripped and a pressure value (a pressure and a depression depth) generated in the contact center position as a grip state of the object. However, in the case of the three axes, although estimation of a position on the input plane is possible, in the case of the two axes, estimation of a position is limited to the y axis or the x axis.

The Hall element group 91 can include the Hall element 81 on one axis (desirably the z axis) among the x axis, the y axis, and the z axis. However, in the case of the one axis, unlike the cases of the two axes and the three axes, although it is difficult to estimate a loading position, a pressure or a depression depth can be estimated.

Moreover, the Hall element group 91 is not limited to the one to three axes described above and can include the Hall elements 81 on four or more axes.

As described above, the input section to which information from an object is inputted in the sensor 21 is formed of the viscoelastic magnet. A change in the bias magnetic fields B corresponding to the deformation of the viscoelastic magnet is detected by the Hall elements as changes in voltages from changes in a magnitude of a density and a direction of a magnetic flux. Therefore, it is possible to accurately acquire, for example, information on a position of contact with an object to be gripped, a pressure, or a depression depth. Consequently, states of pulling load, contact, slide, and vibration phenomena and the like that occur between the input section and the object to be gripped are further detected. Therefore, for example, in gripping and manipulating an arbitrary object in the robot hand manipulator, it is possible to prevent the fall (slip) of the arbitrary object to accurately grip and manipulate the arbitrary object and improve safety for a human.

Moreover, it is possible to realize high-affinity physical interaction with a human using the soft material of the input section (the viscoelastic magnet).

By using the material having high affinity with a human and having softness and slidability as the input section, it is possible to display various functions of a real-world machine and an input device for input to a virtual space. For example, not only the representation by a force and a pressure but also the representation of lateral slip and slide of a material itself (a stick slip phenomenon) can be performed. Therefor, it is possible to form a new-feeling interface that has more various inputting means (i.e., representations).

As described above, the sensor 21 has the simple structure including the three elements of the viscoelastic magnet, the circuit board for detection, and the fixing section. Since the material such as silicon gel is used as a binder, the viscoelastic magnet has a characteristic that the viscoelastic magnet is deformed greatly by a small force. The viscoelastic magnet can be manufactured by a method of molding the general rubber magnet and is inexpensive and easily handled. Moreover, the element that detects a change in a magnetic flux density vector can be realized by combining plural general Hall elements and arranging the Hall elements in appropriate positions with respect to the viscoelastic magnet applied with bias magnetic fields. The element can also be realized inexpensively and easily.

As described above, in the sensor according to the embodiment of the present invention, it is possible to accurately grip and manipulate an arbitrary object easily in the robot hand manipulator and realize higher-affinity physical interaction with a human.

In the above explanation, the sensors 21 are provided in the arm, the hand, and the like of the robot hand manipulator. However, it is also possible to apply the present invention to fields, products, and the like such as joint mechanism sections of various robots, controllers and joy sticks for games, various input devices, shock absorbing devices, ecological measurement devices, health care products, and sports.

The series of processing described above can be executed by hardware or can be executed by software.

When the series of processing is executed by the software, a program forming the software is installed in a computer built in dedicated hardware or a computer capable of executing various functions by installing various programs, for example, a general-purpose personal computer, from a program recording medium.

Figure 31:
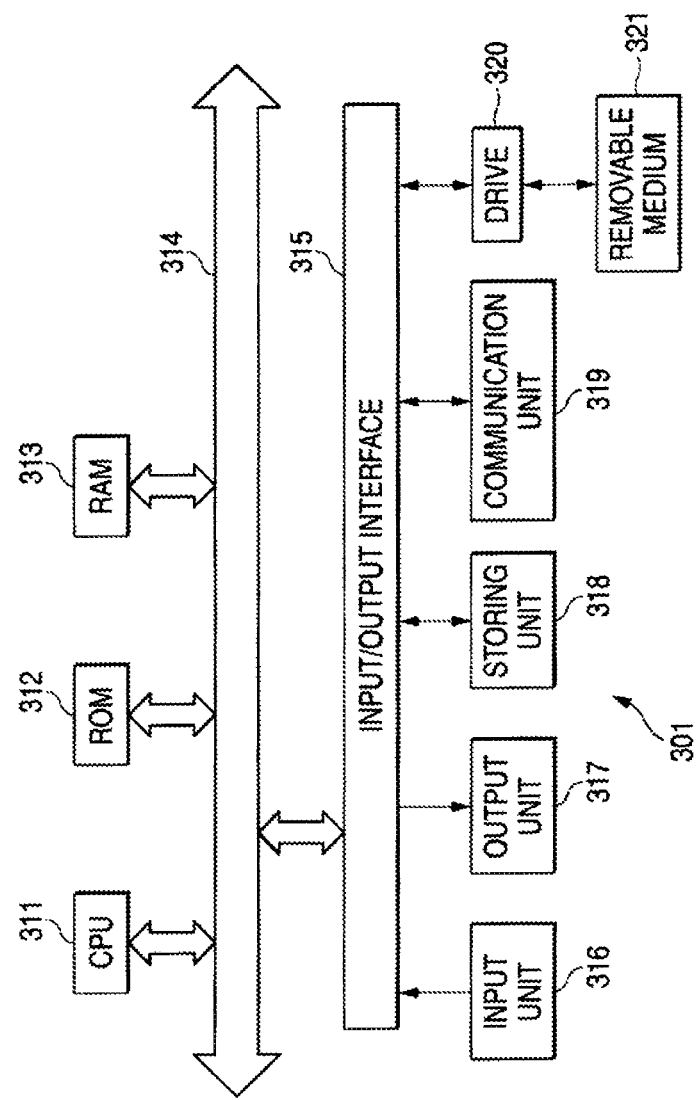
FIG. 31 is a block diagram showing an example of a structure of a personal computer according to an embodiment of the present invention.

FIG. 31 is a block diagram showing an example of a structure of a personal computer 301 that executes the series of processing using a program. A CPU (Central Processing Unit) 311 executes various kinds of processing in accordance with a program stored in a ROM (Read Only Memory) 312 or a storing unit 218. Programs, data, and the like executed by the CPU 311 are stored in a RAM (Random Access Memory) 313 as appropriate. The CPU 311, the ROM 312, and the RAM 313 are connected to one another by a bus 314.

An input/output interface 315 is also connected to the CPU 311 via the bus 314. An input unit 316 including the sensor 21, a keyboard, a mouse, and a microphone and an output unit 317 including a display and a speaker are connected to the input/output interface 315. The CPU 311 executes various kinds of processing in response to commands inputted from the input unit 316. The CPU 311 outputs results of the processing to the output unit 317.

A storing unit 318 connected to the input/output interface 315 includes a hard disk, for example and stores the programs executed by the CPU 311 and various data. A communication unit 319 communicates with external apparatuses via networks such as the Internet and a local area network.

Programs can be acquired via the communication unit 319 and stored in the storing unit 318.

When a removable medium 321 such as a magnetic disk, an optical disk, a magneto-optical disk, or a semiconductor memory is inserted in a drive 320 connected to the input/output interface 315, the drive 320 drives the removable medium 321 and acquires programs, data, and the like recorded in the removable medium 321. The programs and the data acquired are transferred to the storing unit 318 and stored therein when necessary.

Program recording media that store programs installed in the computer and executable by the computer include, as shown in FIG. 31, the removable medium 321 as a package medium such a magnetic disk (including a flexible disk), an optical disk (including a CD-ROM (Compact Disc-Read Only Memory) and a DVD (Digital Versatile Disc), a magneto-optical disk, or a semiconductor memory, the ROM 312 in which programs are temporarily or permanently stored, and the hard disk that forms the storing unit 318. The storage of the programs in the program recording media is performed using wire or wireless communication media such as a local area network, the Internet, a digital satellite broadcast via the communication unit 319 serving as an interface such as a router and a modem when necessary.

In this specification, steps describing the programs stored in the program recording media include not only processing performed in time series according to a described order but also processing executed in parallel or individually, although not always executed in time series.

It should be understood by those skilled in the art that various modifications, combinations, sub-combinations, and alterations may occur depending on design requirements and other factors insofar as they are within the scope of the appended claims or the equivalents thereof.

What is claimed is:

1. A manipulator comprising a detecting device, the detecting device comprising:
a viscoelastic magnet having a first side and a second side opposing the first side; and
a force detecting unit configured to detect an external force causing a deformation of the first side of the viscoelastic magnet, the second side being not deformed.

2. A manipulator according to claim 1, wherein the force detecting unit is configured to detect the external force by detecting a change in a magnetic flux density vector due to the deformation of the first side of the viscoelastic magnet.

3. A controller comprising a detecting device, the detecting device comprising:
- a viscoelastic magnet having a first side and a second side opposing the first side; and
- a force detecting unit configured to detect an external force causing a deformation of the first side of the viscoelastic magnet, the second side being not deformed.

4. A controller according to claim 3, wherein the force detecting unit is configured to detect the external force by detecting a change in a magnetic flux density vector due to the deformation of the first side of the viscoelastic magnet.

5. An input device comprising a detecting device, the detecting device comprising:
- a viscoelastic magnet having a first side and a second side opposing the first side; and
- a force detecting unit configured to detect an external force causing a deformation of the first side of the viscoelastic magnet, the second side being not deformed.

6. An input device according to claim 5, wherein the force detecting unit is configured to detect the external force by detecting a change in a magnetic flux density vector due to the deformation of the first side of the viscoelastic magnet.

7. A device comprising:
- a viscoelastic magnet having a first side and a second side opposing the first side; and
- a force detecting unit configured to detect an external force causing a deformation of the first side of the viscoelastic magnet, the second side being not deformed.

8. A device according to claim 7, wherein the force detecting unit is configured to detect the external force by detecting a change in a magnetic flux density vector due to the deformation of the first side of the viscoelastic magnet.

9. A device according to claim 8, wherein the force detecting unit is formed of a magnetism detecting element that detects a change in the magnetic flux density vector on one axis in an XYZ coordinate system and converts the change into an output voltage.

10. A device according to claim 9, wherein the magnetism detecting element is arranged such that the one axis is substantially parallel to a bias magnetization direction of the viscoelastic magnet.

11. A device according to claim 10, wherein a midpoint voltage of the output voltage from the magnetism detecting element is set according to a direction of loading on the viscoelastic magnet and the deformation of the first side of the viscoelastic magnet.

12. A device according to claim 9, further comprising an information detecting unit for detecting information on a loading pressure applied by an external object on the viscoelastic magnet using the output voltage from the magnetism detecting element.

13. A device according to claim 8, wherein the force detecting unit is formed of magnetism detecting elements that detect changes in the magnetic flux density vector on two axes in an XYZ coordinate system and convert the changes into output voltages.

14. A device according to claim 13, wherein the magnetism detecting element that detects a change in the magnetic flux density vector on one axis of the two axes is arranged such that the one axis is substantially parallel to a bias magnetization direction of the viscoelastic magnet, and the magnetism detecting element that detects a change in the magnetic flux density vector on the other axis of the two axes is arranged such that the other axis is substantially perpendicular to the one axis.

15. A device according to claim 14, wherein a midpoint voltage of the output voltage from the magnetism detecting element that detects a change in the magnetic flux density vector on the one axis is set according to a direction of loading on the viscoelastic magnet and the deformation of the first side of the viscoelastic magnet.

16. A device according to claim 13, wherein there are two magnetism detecting elements that detect a change in the magnetic flux density vector on the other axis and the magnetism detecting elements are arranged such that a center of the two magnetism detecting elements is located on the one axis.

17. A device according to claim 13, further including an information detecting unit for detecting information on a loading pressure on the viscoelastic magnet and information on a loading center position using the output voltages from the magnetism detecting elements.

18. A device according to claim 8, wherein the force detecting unit is formed of magnetism detecting elements that detect changes in the magnetic flux density vector on three axes in an XYZ coordinate system and convert the changes into output voltages.

19. A device according to claim 18, wherein the magnetism detecting element that detects a change in the magnetic flux density vector on a first axis among the three axes is arranged substantially parallel to a bias magnetization direction of the viscoelastic magnet, and the magnetism detecting elements that detect changes in the magnetic flux density vector on a second axis and a third axis among the three axes are arranged, respectively, such that, when the first axis is a z axis, the second axis and the third axis are an x axis and a y axis with respect to the z axis.

20. A device according to claim 19, wherein a midpoint voltage of the output voltage from the magnetism detecting element that detects a change in the magnetic flux density vector on the first axis is set according to a direction of loading on the viscoelastic magnet and the deformation of the first side of the viscoelastic magnet.

21. A device according to claim 18, wherein there are two magnetism detecting elements that detect a change in the magnetic flux density vector on each of the second axis and the third axis and the magnetism detecting elements are arranged such that a center of the two magnetism detecting elements is located on the first axis.

22. A device according to claim 18, further comprising an information detecting unit for detecting information on a loading pressure on the viscoelastic magnet and information on a loading center position using the output voltages from the magnetism detecting elements.

23. A device according to claim 7, wherein a thin film is formed on the surface of the viscoelastic magnet.

* * * * *